(12) United States Patent
Liu et al.

(10) Patent No.: US 11,107,922 B2
(45) Date of Patent: Aug. 31, 2021

(54) GATE STRUCTURE AND METHOD WITH ENHANCED GATE CONTACT AND THRESHOLD VOLTAGE

(71) Applicant: Taiwan Semiconductor Manufacturing Co., Ltd., Hsin-Chu (TW)

(72) Inventors: Max Liu, New Taipei (TW); Yen-Ming Peng, Taoyuan County (TW); Wei-Shuo Ho, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 60 days.

(21) Appl. No.: 16/729,415

(22) Filed: Dec. 29, 2019

(65) Prior Publication Data

US 2020/0144422 A1    May 7, 2020

Related U.S. Application Data

(62) Division of application No. 15/884,614, filed on Jan. 31, 2018, now Pat. No. 10,840,376.

(60) Provisional application No. 62/591,895, filed on Nov. 29, 2017.

(51) Int. Cl.
| | | |
|---|---|---|
| H01L 29/78 | (2006.01) | |
| H01L 29/08 | (2006.01) | |
| H01L 29/165 | (2006.01) | |
| H01L 29/417 | (2006.01) | |
| H01L 29/66 | (2006.01) | |
| H01L 21/762 | (2006.01) | |
| H01L 21/02 | (2006.01) | |
| H01L 21/306 | (2006.01) | |
| H01L 21/324 | (2006.01) | |
| H01L 21/8238 | (2006.01) | |

(52) U.S. Cl.
CPC .... *H01L 29/7848* (2013.01); *H01L 21/02381* (2013.01); *H01L 21/02532* (2013.01); *H01L 21/02579* (2013.01); *H01L 21/02667* (2013.01); *H01L 21/30625* (2013.01); *H01L 21/324* (2013.01); *H01L 21/76224* (2013.01); *H01L 21/823821* (2013.01); *H01L 29/0847* (2013.01); *H01L 29/165* (2013.01); *H01L 29/41791* (2013.01); *H01L 29/66545* (2013.01); *H01L 29/66795* (2013.01); *H01L 29/785* (2013.01)

(58) Field of Classification Search
CPC ..... H01L 21/823431; H01L 21/823821; H01L 27/0866; H01L 27/0924; H01L 21/845; H01L 27/10826; H01L 27/10879; H01L 27/1211; H01L 29/41791; H01L 29/66795; H01L 29/785; H01L 29/7848; H01L 29/66545
See application file for complete search history.

*Primary Examiner* — John A Bodnar
(74) *Attorney, Agent, or Firm* — Haynes and Boone, LLP

(57) ABSTRACT

The semiconductor structure includes a semiconductor substrate having a first region and a second region being adjacent to the first region; first fins formed on the semiconductor substrate within the first region; a first shallow trench isolation (STI) feature disposed on the semiconductor substrate within the second region; and a first gate stack that includes a first segment disposed directly on the first fins within the first region and a second segment extending to the first STI feature within the second region. The second segment of the first gate stack includes a low resistance metal (LRM) layer, a first tantalum titanium nitride layer, a titanium aluminum nitride layer, and a second tantalum titanium nitride layer stacked in sequence. The first segment of the first gate stack within the first region is free of the LRM layer.

20 Claims, 30 Drawing Sheets

GATE STRUCTURE AND METHOD WITH ENHANCED GATE CONTACT AND THRESHOLD VOLTAGE

PRIORITY DATA

This application is a Divisional of U.S. patent application Ser. No. 15/884,614, filed Jan. 31, 2018, which claims priority to U.S. Provisional Patent Application Ser. No. 62/591,895 filed Nov. 29, 2017, the entire disclosures of which are hereby incorporated herein by reference.

BACKGROUND

An integrated circuit is formed on a semiconductor substrate and includes various devices, such as transistors, diodes, and/or resistors, configured and connected together to a functional circuit. Especially, the integrated circuit further includes field-effect transistors, such as metal-oxide-semiconductor FETs (MOSFETs) or complimentary MOS-FETs, wherein each includes a gate electrode to control the channel region of the corresponding FET. When a semiconductor device such as a MOSFET is scaled down through various technology nodes, high k dielectric material and metal are adopted to form a gate stack. However, in a method to form metal gate stacks for n-type MOS (nMOS) transistors and p-type MOS (pMOS) transistors, various issues may arise when integrating the processes and materials for this purpose. For example, when a filling metal is used to form metal gate, it may inadvertently increase the threshold voltage of the transistor. Furthermore, the non-uniformity of the metal gate causes device performance variation. Thus, to fabricate various devices in a same substrate, the manufacturing cost, material integration, and device performance (such as transistor threshold voltage and contact resistance) are all factors to be considered. Therefore, it is therefore desired to have a new device structure and the method making the same to address the above concerns with enhanced circuit performance.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
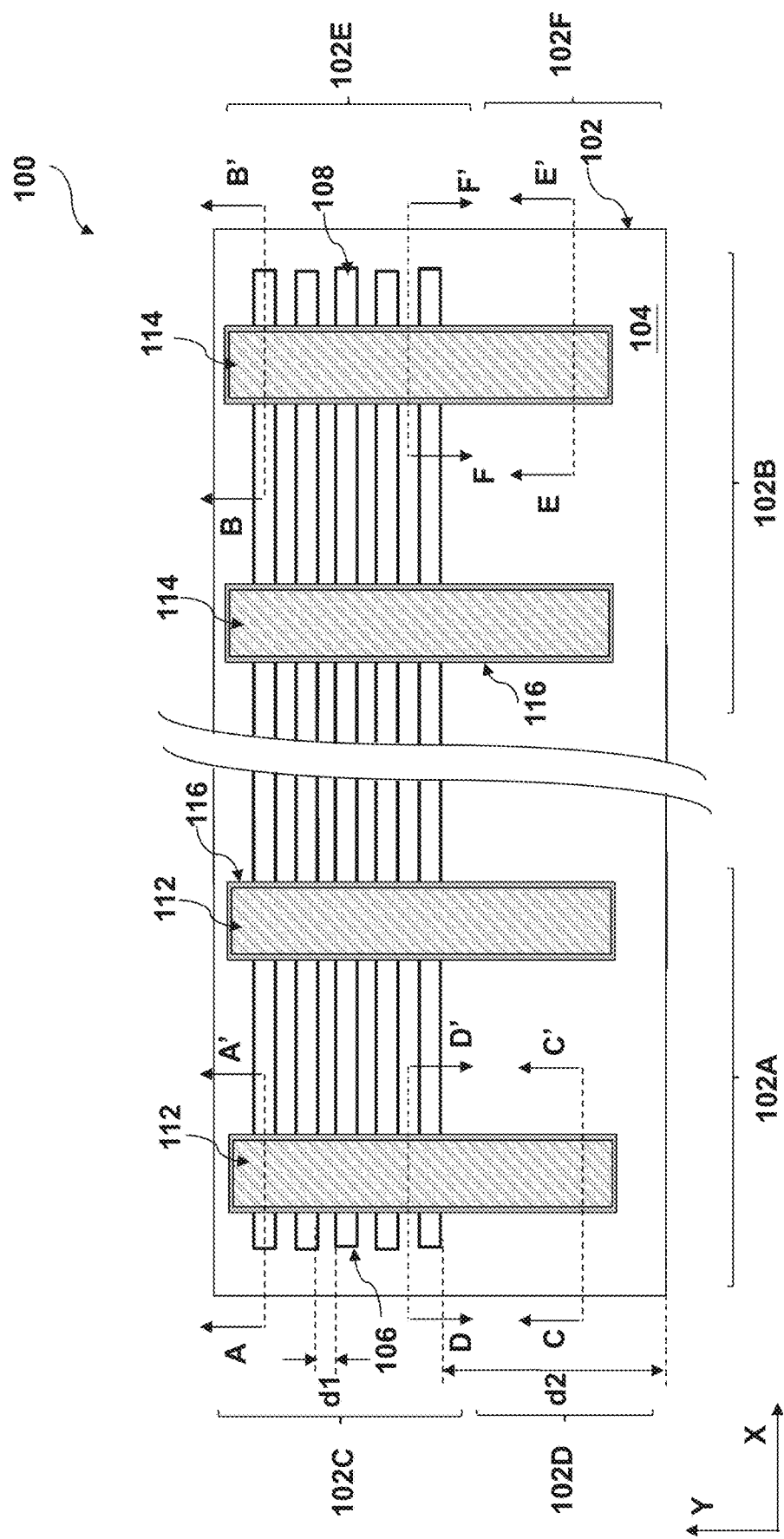
FIG. 1A is a top view of a semiconductor device structure constructed according to various aspects of the present disclosure in one embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is to be understood that the following disclosure provides many different embodiments, or examples, for implementing different features of various embodiments. Specific examples of components and arrangements are described below to simplify the present disclosure. These are, of course, merely examples and are not intended to be limiting.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1B:
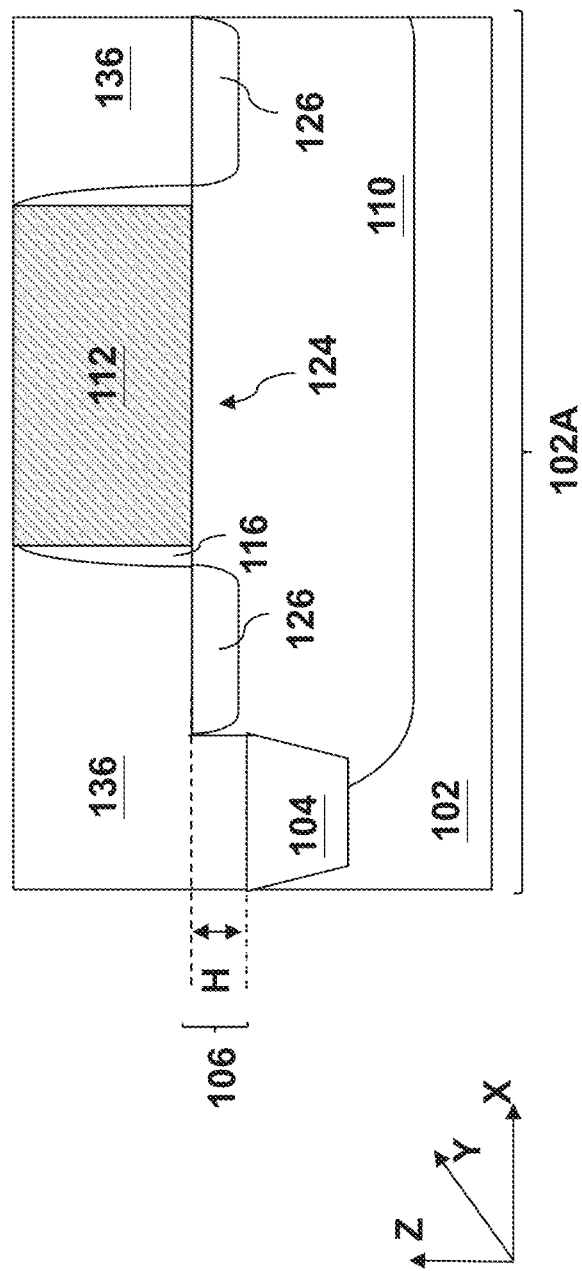
FIGS. 1B and 1C are sectional views of the semiconductor structure of FIG. 1A taken along the dashed lines AA' and BB' respectively, in accordance with some embodiments.
Figure 1C:
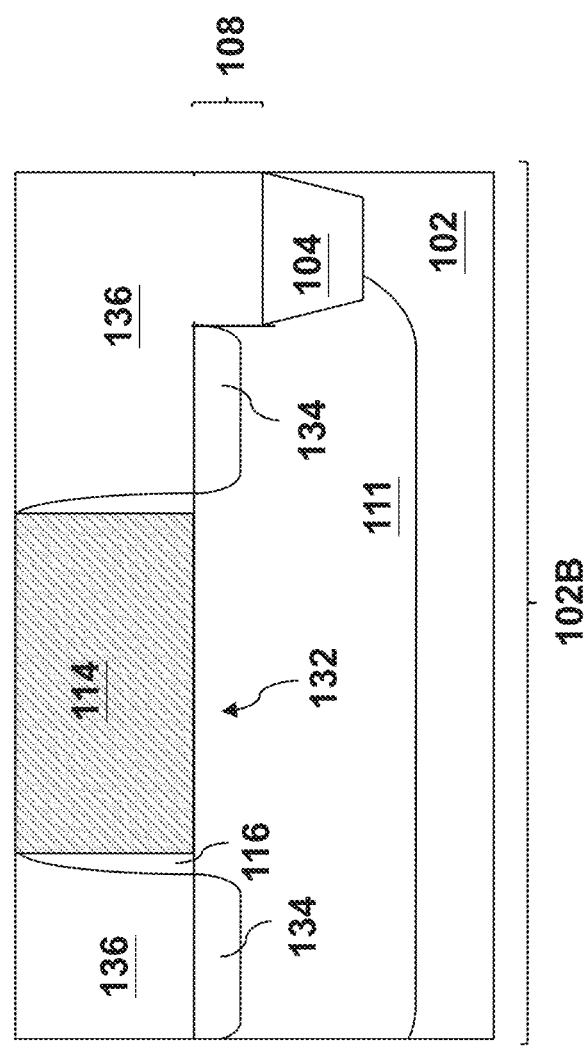

FIG. 1A is a sectional view of a semiconductor structure (or a work piece) 100 constructed according to various aspects of the present disclosure in one embodiment. FIG. 1B is a sectional view of the semiconductor structure 100, in portion, along the dashed lines AA' in accordance with some embodiments. FIG. 1C is a sectional view of the semiconductor structure 100, in portion, along the dashed lines BB' in accordance with some embodiments. The semiconductor structure 100 and the method making the same are collectively described with reference to FIGS. 1A through 1C and other figures. In some embodiments, the semiconductor structure 100 is formed on fin active regions and includes fin field-effect transistors (FinFETs). In some embodiments, the semiconductor structure 100 is formed on flat fin active regions and includes plain field-effect transistors (FETs). The semiconductor structure 100 includes a dual gate dielectric FET that may be n-type, p-type, a complementary MOSFET having both an n-type FET (nFET) and a p-type FET (pFET). As an example for illustration only but not limiting, the dual gate dielectric FET is an nFET.

The semiconductor structure 100 includes a substrate 102. The substrate 102 includes a bulk silicon substrate. Alternatively, the substrate 102 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 102 also include a silicon-on-insulator (SOI) substrate. SOI substrates are fabricated using separation by implantation of oxygen (SIMOX), wafer bonding, and/or other suitable methods.

The substrate 102 also includes various isolation features, such as isolation features 104 formed on the substrate 102 and defining various active regions on the substrate 102, such as first active regions 106 in a first region 102A and second active regions 108 in a second region 102B. In the present embodiment, the first active regions 106 are designed for various nFETs to be formed thereon; and the second active regions 108 are designed for various pFETs to be formed thereon. The isolation feature 104 utilizes isolation technology, such as local oxidation of silicon (LOCOS) and/or shallow trench isolation (STI), to define and electrically isolate the various active regions. The isolation feature 104 includes silicon oxide, silicon nitride, silicon oxynitride, other suitable dielectric materials, or combinations thereof. The isolation feature 104 is formed by any suitable process. As one example, forming STI features includes a lithography process to expose a portion of the substrate, etching a trench in the exposed portion of the substrate (for example, by using a dry etching and/or wet etching), filling the trench (for example, by using a chemical vapor deposition process) with one or more dielectric materials, and planarizing the substrate and removing excessive portions of the dielectric material(s) by a polishing process, such as a chemical mechanical polishing (CMP) process. In some examples, the filled trench may have a multi-layer structure, such as a thermal oxide liner layer and filling layer(s) of silicon nitride or silicon oxide.

The active regions (such as 106 and 108) are those regions with semiconductor surface wherein various doped features are formed and configured to one or more device, such as a diode, a transistor, and/or other suitable devices. The active regions may include a semiconductor material similar to that (such as silicon) of the bulk semiconductor material of the substrate 102 or different semiconductor material, such as silicon germanium (SiGe), silicon carbide (SiC), or multiple semiconductor material layers (such as alternatively silicon and silicon germanium layers) formed on the substrate 102 by epitaxial growth, for performance enhancement, such as strain effect to increase carrier mobility. The first active regions 106 and the second active regions 108 each have an elongated shape oriented in the X direction. The X direction is orthogonal to the Y direction, both X and Y directions defining the top surface of the substrate 102. The top surface has a normal direction along the Z direction, which is orthogonal to both X and Y directions.

In the present embodiment, the active regions 106 and 108 are three dimensional, such as fin active regions extruded above the substrate 102. The fin active regions are extruded from the substrate 102 and provide three-dimensional profiling for more effective coupling between the channel region (or simply referred to as channel) and the gate electrode. The fin active regions may be formed by selective etching to recessing the isolation features 104, or selective epitaxial growth to grow active regions with a semiconductor same or different from that of the substrate 102, or a combination thereof. The first fin active regions 106 and the second fin active regions 108 are also simply referred to as first fins 106 and second fins 108, respectively.

The first fins 106 are disposed in the first region 102A and are adjacent with isolation feature with large dimensions. Thus the first region 102A is further divided into two sub-regions: an inter-fin region 102C and an isolation region 102D. The inter-fin region 102C and the isolation region 102D substantially differ in pattern density and therefore in fabrication behavior. In the inter-fin region 102C, the first fins 106 are configured densely with small gaps between the adjacent fins. Even though the isolation features 104 are still present in the fin gaps of the inter-fin region, the dimensions (such as d1 in FIG. 1A) of those gaps along the Y direction are substantially less than the dimension d2 of the isolation feature 104 in the isolation region 102D. In some examples, the ratio d2/d1 is greater than 5. In some examples, the ratio d2/d1 is greater than 10. In the inter-fin region 102C, the number of the first fins 106 is greater than 5 according to some embodiments.

Similarly, the second region 102B is also divided into two sub-regions: an inter-fin region 102E and an isolation region 102F. The inter-fin region 102E and the isolation region 102F substantially differ in pattern density in a way similar to those of the first region 102A. Particularly, in the inter-fin region 102E, the second fins 108 are configured densely with small gaps between the adjacent fins. The dimensions of those gaps along the Y direction are substantially less than the dimension of the isolation feature 104 in the isolation region 102F, such as the ratio of those two dimensions being greater than 5, or greater than 10 according to various examples. In the inter-fin region 102E, the number of the second fins 108 is greater than 5 according to some embodiments.

The semiconductor substrate 102 further includes various doped features, such as n-type doped wells, p-type doped wells, source and drain, other doped features, or a combination thereof configured to form various devices or components of the devices. In the present embodiment, the semiconductor substrate 102 includes a doped well 110 of a first-type in the first region 102A. The doped well 110 is doped with a p-type dopant (therefore referred to as p-well). The p-well 110 is formed in the first fins 106. The dopant (such as boron) in the p-well 110 may be introduced to the first fins 106 by ion implantation or other suitable technology. For example, the p-well 110 may be formed by a procedure that includes forming a patterned mask with an opening on the substrate 102 wherein the opening defines the region for the p-well 110; and performing an ion implantation to introduce a p-type dopant (such as boron) into the first fins 106 using the patterned mask as an implantation mask. The patterned mask may be a patterned resist layer formed by lithography or a pattern hard mask formed by deposition, lithography process and etching.

Similarly, the semiconductor substrate 102 may include a second-type doped well 111 in the second region 102B, wherein the second-type is opposite to the first-type in conductivity. In the present example, the doped well 111 is doped with an n-type dopant (therefore referred to as n-well). The n-well 111 is formed in the second fins 108. The dopant (such as phosphorous) in the n-well 111 may be introduced to the second fins 108 by ion implantation or other suitable technology.

The semiconductor structure 100 further includes a first gate stack 112 disposed in the first region 102A and having an elongated shape oriented in the Y direction. The first gate stack 112 is disposed on the first fins 106 in the inter-fin region 102C and continuously extends from the inter-fin region 102C to the isolation region 102D. The first gate stack 112 includes a gate dielectric layer and a gate electrode formed thereon. Furthermore, the first gate stack 112 has different structures in the inter-fin region 102C and the isolation region 102D, which is further described in detail later. Gate spacer 116 may be further formed on the sidewalls of the first gate stack 112. In some examples, the gate spacer 116 includes silicon oxide, silicon nitride, silicon oxynitride, other suitable dielectric material or a combination thereof. The gate spacer 116 may have a multilayer structure and may be formed by depositing dielectric material and then anisotropic etching, such as plasma etching.

The semiconductor structure 100 further includes a second gate stack 114 disposed in the second region 102B and having an elongated shape oriented in the Y direction. The second gate stack 114 is disposed on the second fins 108 in the inter-fin region 102E and continuously extends from the inter-fin region 102E to the isolation region 102F. The second gate stack 114 includes a gate dielectric layer and a gate electrode formed thereon. The second gate stack 114 is different from the first gate stack 112. Furthermore, the second gate stack 114 has different structures in the inter-fin region 102E and the isolation region 102F. The gate spacer 116 may be further formed on the sidewalls of the second gate stack 114. The first gate stack 112 and the second gate stack 114 are formed in a gate-last process, in which dummy gate stacks are formed first and then replaced by metal gate stacks by a procedure that includes etching, deposition and polishing.

Figure 3:
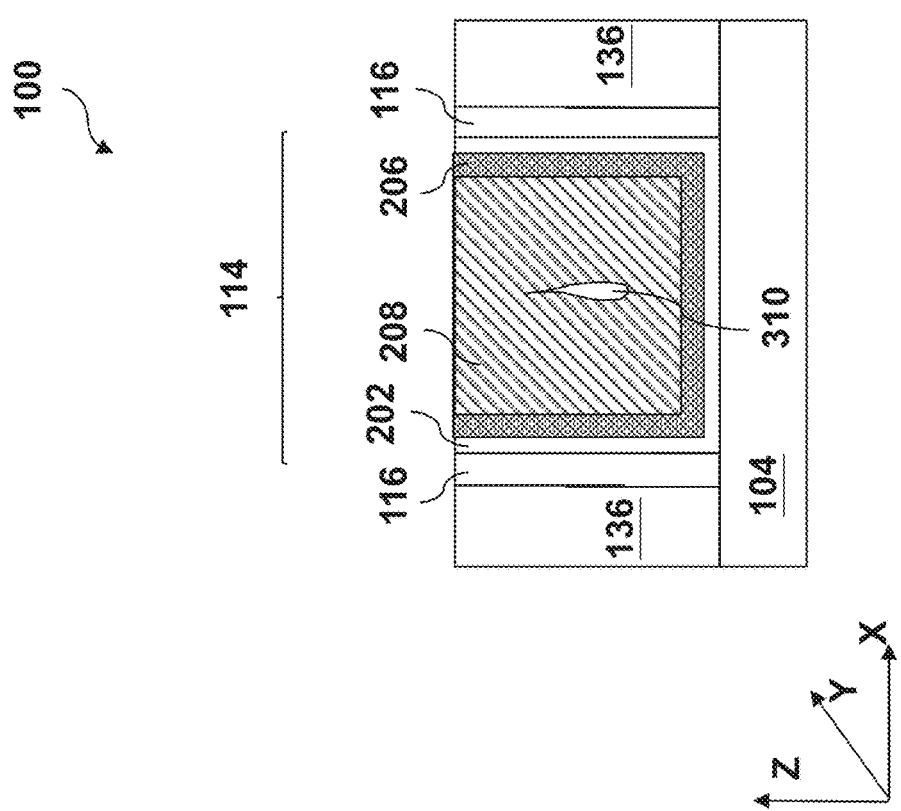
FIGS. 2 and 3 are sectional views of the semiconductor structure of FIG. 1A taken along the dashed lines CC' and EE' respectively, in accordance with some embodiments.
Figure 2:
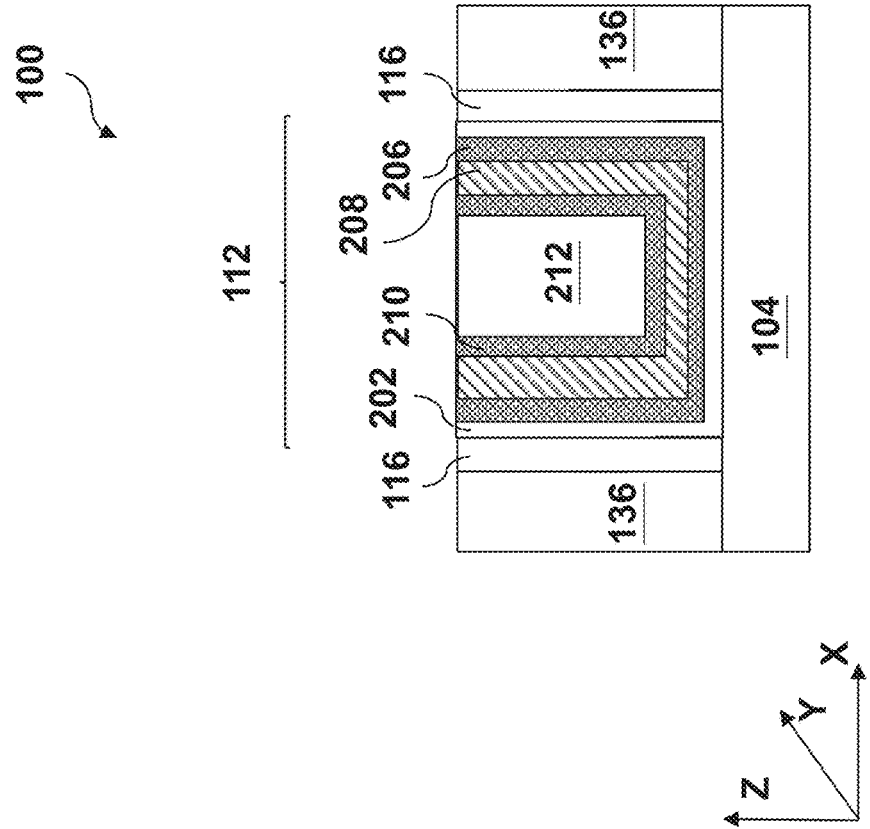
Figure 5:
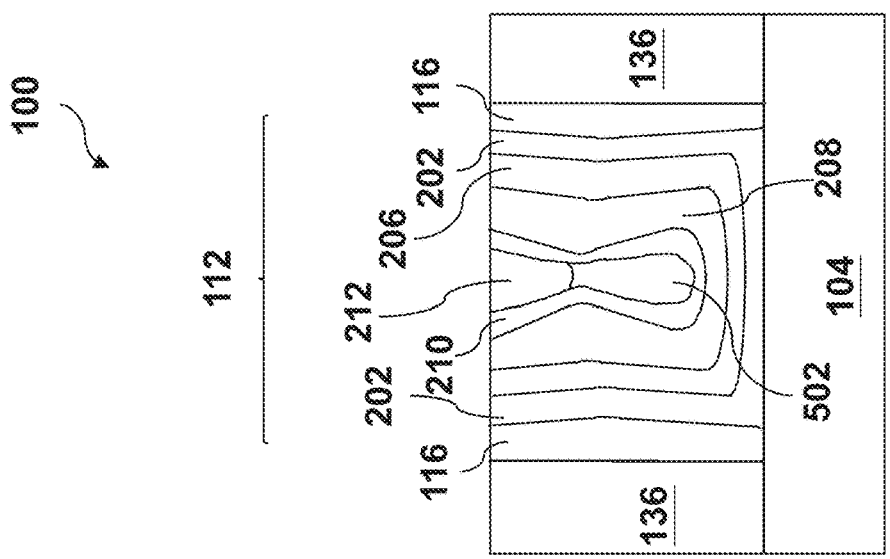
FIGS. 4 and 5 are sectional views of the semiconductor structure of FIG. 1A taken along the dashed line DD', in accordance with various embodiments.
Figure 4:
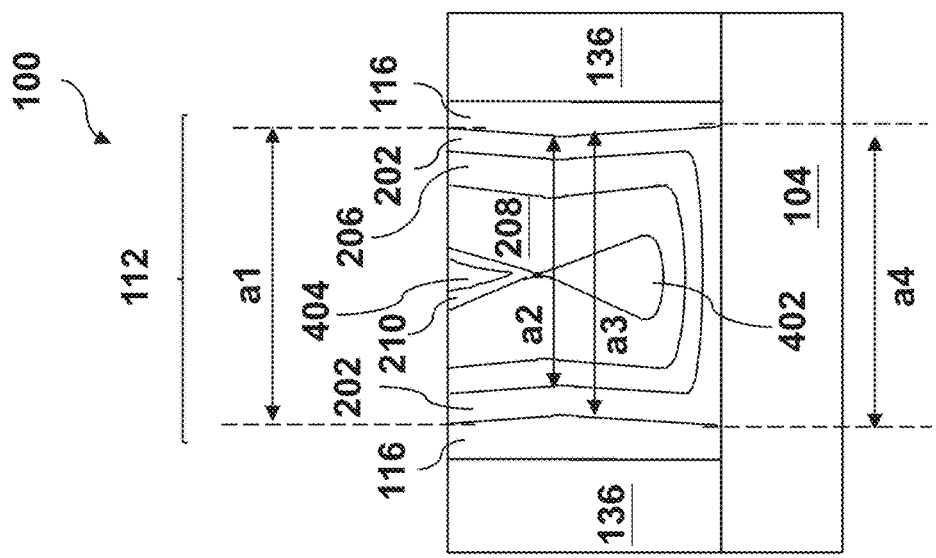
Figure 7:
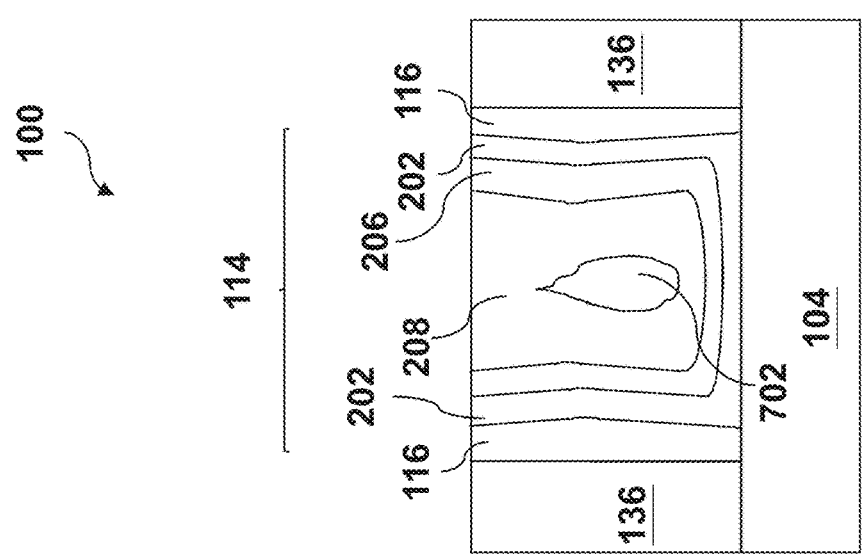
FIGS. 6 and 7 are sectional views of the semiconductor structure of FIG. 1A taken along the dashed line FF', in accordance with various embodiments.
Figure 6:
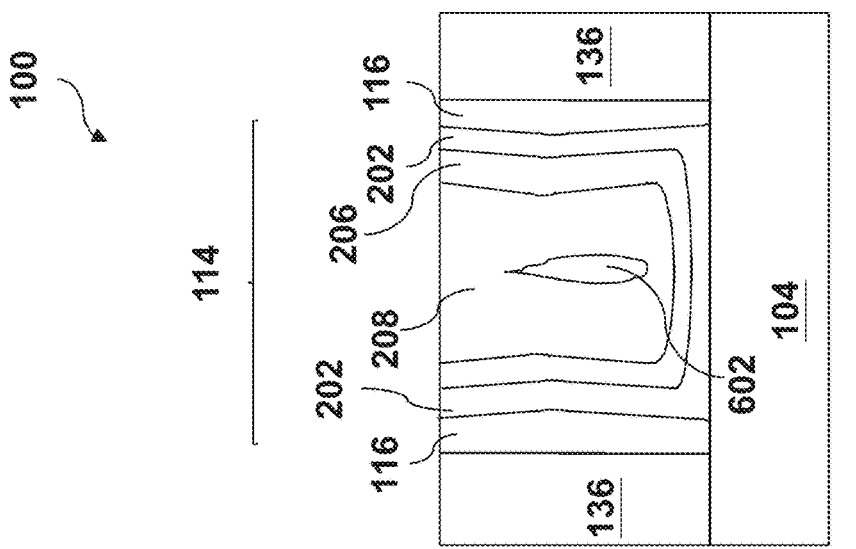

The first gate stack 112 and the second gate stack 114 are further described in details with reference to FIGS. 2-7, which are sectional views of the semiconductor structure 100, in portion, constructed according to various aspects of the present disclosure. Specifically, FIG. 2 is a sectional view of the first gate stack 112 in the isolation region 102D taken along the dashed line CC'; FIG. 3 is a sectional view of the second gate stack 114 in the isolation region 102F taken along the dashed line EE'; FIGS. 4 and 5 are sectional views of the first gate stack 112 in the inter-fin region 102C taken along the dashed line DD' in the gap between the adjacent fins according to various embodiments; and FIGS. 6 and 7 are sectional views of the second gate stack 114 in the inter-fin region 102E taken along the dashed line FF' in the gap between the adjacent fins according to various embodiments. The first gate stack 112 and the second gate stack 114 are described below in parallel for comparison.

The first gate stack 112 includes a first segment in the isolation region 102D and a second segment in the inter-fin region 102C. The first segment of the first gate stack 112 in the isolation region 102D is illustrated in FIG. 2. The first gate stack 112 in the first segment includes a gate dielectric layer 202 and a gate electrode. The gate dielectric layer 202 may include a dielectric material, such as silicon oxide, silicon nitride, silicon oxynitride, a high-k dielectric material. In the present embodiment, the gate dielectric layers a high-k dielectric material layer, such as metal oxide, metal nitride or metal oxynitride. In various examples, the high k dielectric material layer includes metal oxide: ZrO2, Al2O3, and HfO2, formed by a suitable method, such as metal organic chemical vapor deposition (MOCVD), physical vapor deposition (PVD), atomic layer deposition (ALD), or molecular beam epitaxy (MBE). In some embodiments, the gate dielectric layer 202 is formed in a high-k-last process, so the gate dielectric layer is U-shaped and surrounding the gate electrode from bottom surface and sidewalls. The gate dielectric layer 202 may further include an interfacial layer interposed between the semiconductor substrate 102 and the high k dielectric material. The interfacial layer includes silicon oxide formed by ALD, thermal oxidation or ultra-violet-Ozone Oxidation, according to some examples.

Still referring to FIG. 2, the gate electrode of the first gate stack 112 in the first segment includes a first tantalum titanium nitride layer 206, a titanium aluminum nitride layer 208, and a second tantalum titanium nitride layer 210, and a low resistance metal (LRM) layer 212 stacked in sequence. The first tantalum titanium nitride layer 206, the titanium aluminum nitride layer 208, and the second tantalum titanium nitride layer 210 are all U-shaped and are wrapped around the LRM layer 212. The LRM layer 212 includes one low resistance metal, such as tungsten, copper, aluminum, aluminum copper alloy or other suitable metal/metal alloy with low resistivity.

The second gate stack 114 also includes a first segment in the isolation region 102F and a second segment in the inter-fin region 102E. The first segment of the second gate stack 114 in the isolation region 102E is illustrated in FIG. 3. The second gate stack 114 in the first segment includes a gate dielectric layer 202 and a gate electrode. The gate dielectric layer 202 is similar to that of the first gate stack 112. For example, the gate dielectric layer 202 may include a dielectric material, such as silicon oxide, silicon nitride, silicon oxynitride, a high-k dielectric material. In the present embodiment, the gate dielectric layers a high-k dielectric material layer, such as metal oxide, metal nitride or metal oxynitride, formed by a suitable method, such as MOCVD, PVD, ALD, or MBE. In some embodiments, the gate dielectric layer 202 may further include an interfacial layer interposed between the semiconductor substrate 102 and the high k dielectric material.

Still referring to FIG. 3, the gate electrode of the second gate stack 114 in the first segment includes a first tantalum titanium nitride layer 206 and a titanium aluminum nitride layer 208. However, the second gate stack 114 is free of LRM and is further free of the second tantalum titanium nitride layer 210. The first tantalum titanium nitride layer 206 is U-shaped and being surrounded by the gate dielectric layer 202 that is also U-shaped in the present embodiment. Furthermore, the titanium aluminum nitride layer 208 is shaped with a void (also referred to as air gap) 310 defined therein. First gate stack 112 and the second gate stack 114 are different from each other while comparing the respective first segment within the isolation region, as described above.

The first and second gate stacks in the corresponding inter-fin regions have different structures as well and are described below with reference to FIGS. 4 and 5. The corresponding structure is illustrated in FIG. 4 when the number of the first fins 106 within the inter-fin region 102C is greater than 5; and is illustrated in FIG. 5 when the number of the first fins 106 within the inter-fin region 102C is equal to 2. The second segment of the first gate stack 112 in the inter-fin region 102C is different from the first segment.

Referring to FIG. 4, the second segment of the first gate stack 112 in the inter-fin region 102C includes the gate dielectric layer 202 similar to that of the first segment. For example, the gate dielectric layer 202 includes a high-k dielectric material layer, such as metal oxide, metal nitride or metal oxynitride. The gate electrode of the first gate stack 112 in the second segment includes the first tantalum titanium nitride layer 206, the titanium aluminum nitride layer 208, and the second tantalum titanium nitride layer 210. However, the gate electrode of the first gate stack 112 in the second segment encloses one or more void, such as voids 402 and 404. When the number of fins in the inter-fin region 102C is greater than 5, the second segment is free of the LRM.

The second segment has narrow wrist in the X direction while the first segment has substantially vertical sidewalls. All above are related to the method of making the gate stack and the loading effect associated with. The second segment of the first gate stack 112 within the inter-fin region 102C spans different dimensions along the X direction at different level. Particularly, the second segment spans a first dimension a1 at the top surface of the first gate stack 112; a second dimension a2 as the narrowest (or minimum dimension) at a certain level; a third dimension a3 at the middle of the first gate stack 112; and a fourth dimension a4 at the bottom surface of the first gate stack 112. The minimum dimension a2 is at the level substantially coincident with or substantially close to the top surface of the first fins 106. It is noted that the top surface of the first fins 106 is above the top surface of the isolation features 104, where the vertical height difference is referred to as fin height H, as illustrated in FIG. 1B. Among the above dimensions, a4>a3>a1>a2. In some embodiments, a first ratio of a1/a2 is greater than 1.1; a second ratio of a3/a2 is greater than 1.2; and a third ratio of a4/a2 is greater than 1.4.

When the number of the first fins 106 is equal to 2, the first segment of the first gate stack 112 within the inter-fin region 102C has some differences, as illustrated in FIG. 5. The gate electrode of the first gate stack 112 in the second segment still has a similar narrow wrist and includes the first tantalum titanium nitride layer 206, the titanium aluminum nitride layer 208, the second tantalum titanium nitride layer 210, and also the LRM layer 212. However, as void 502 is formed inside the second tantalum titanium nitride layer 210, the LRM layer 212 is only disposed above the void 502 and caps the void 502.

The second segment of the second gate stack 114 in the inter-fin region 102E is described with reference to FIG. 6 when the number of fins in the inter-fin region 102E is equal to 2 and with reference to FIG. 7 when the number of fins in the inter-fin region 102E is greater than 5. Referring to FIG. 7, the second segment of the second gate stack 114 in the inter-fin region 102E includes the gate dielectric layer 202 similar to that of the first segment. For example, the gate dielectric layer 202 includes a high-k dielectric material layer, such as metal oxide, metal nitride or metal oxynitride. The gate electrode of the second gate stack 114 in the second segment includes the first tantalum titanium nitride layer 206 and the titanium aluminum nitride layer 208; is free of the second tantalum titanium nitride layer 210 and the LRM layer 212; and encloses one or more void, such as a void 702, which has a size greater than the void 310.

When the number of fins in the inter-fin region 102E is equal to 2, the void 602 is less than the void 702 but greater than the void 310 in size. However, the second segment of the second gate stack 114 in the inter-fin region 102E has a narrow wrist (as illustrated in FIGS. 6 and 7) in the X direction while the first segment has substantially vertical sidewalls in a way similar to that of the first gate stack 112.

Referring back to FIGS. 1A-1C, the semiconductor structure 100 includes a channel region 124 defined on the first fins 106 and underlying the first gate stack 112. The channel 124 may be tuned for proper threshold voltage or other parameters by ion implantation. The channel 124 has a same type of dopant (p-type) to that of the p-well 110 but with a greater doping concentration, depending on the application and device specification.

The semiconductor structure 100 includes source/drain (S/D) features (or simply referred to as source and drain) 126 formed on the first fins 106 on opposite sides of the first gate stack 112. The S/D features 126 are doped with n-type dopant (such as phosphorous). The S/D features 126 may be formed by ion implantation and/or diffusion. Other processing steps may be further included to form the S/D features. For example, a rapid thermal annealing (RTA) process may be used to activate the implanted dopant. The S/D features may have different doping profiles formed by multi-step implantation. For example, additional doping features such as light doped drain (LDD) or double diffused drain (DDD) may be included. Also, the S/D features 126 may have different structures, such as raised, recessed, or strained. For example, the formation of the S/D features may include an etching to recess the source and drain regions; epitaxial growth to form epitaxial S/D features with in-situ doping;

and an annealing for activation. The channel 124 is interposed between the S/D features 126.

The semiconductor structure 100 includes a channel region 132 defined on the second fins 108 and underlying the second gate stack 114. The channel 132 may be tuned for proper threshold voltage or other parameters by ion implantation. The channel 132 has a same type of dopant (n-type) to that of the n-well 111 but with a greater doping concentration, depending on the application and device specification.

The semiconductor structure 100 includes S/D features 134 formed on the second fins 108 on opposite sides of the second gate stack 114. The S/D features 134 are doped with p-type dopant (such as boron). The S/D features 134 may be formed by ion implantation and/or diffusion. Other processing steps, such RTA, may be further included to form the S/D features. The S/D features may have different doping profiles formed by multi-step implantation, such as LDD or DDD. Also, the S/D features 134 may have different structures, such as raised, recessed, or strained by a similar procedure to form the S/D features 126. The channel 132 is interposed between the S/D features 134.

In the present embodiment, the S/D features are epitaxial source and drain. The epitaxial S/D features may be formed by selective epitaxial growth for straining effect with enhanced carrier mobility and device performance. The S/D features are formed by one or more epitaxial growth (epitaxial process), whereby silicon (Si) features, silicon germanium (SiGe) features, silicon carbide (SiC) features, and/or other suitable semiconductor features are grown in a crystalline state on the fins within the source and drain regions (such as defined by a patterned hard mask).

The semiconductor structure 100 may further include other features, such as an interconnection structure that further includes metal lines from multiple metal layers to provide horizontal electrical connections; contacts to provide vertical connections from the substrate to the metal lines; and vias to provide vertical connections between metal lines in adjacent metal layers. The contacts include contacts to source and drain and gate contact to gate electrode. Particularly, the gate contact to the first gate stack 112 is configured to land on the first segment of the first gate stack 112 within the isolation region 102D.

The channel 124, the S/D features 126 and the first gate stack 112 are configured to form an nFET in the first region 102A. The channel 132, the S/D features 134 and the second gate stack 114 are configured to form a pFET in the second region 102B. Due to the structures of the nFET and pFET, each gate has a work function tuned with respective gate electrode and a threshold voltage reduced for enhanced device performance. Furthermore, the first gate stack 112, as the gate stack of the nFET, includes the first segment within the isolation region 102D with different structure from the second segment within the inter-fin region 102C. The first segment includes the LRM while the second segment is free of the LRM. As the gate contact is disposed and is landing on the first segment of the first gate stack 112 in the isolation region 102D, the contact resistance between the gate electrode and the gate contact is substantially reduced. The second segment of the first gate stack 112 is disposed on the first fins 106 and is overlying the channel region of the corresponding nFET, the work function of the gate electrode will have impact to the threshold voltage of the corresponding nFET. Without the LRM in the second segment, the threshold voltage of the corresponding nFET is reduced. For example, when tungsten is used in the LRM as the filling metal, it is also have fluorine incorporated in. Fluorine will increase the threshold voltage. Threshold voltage is reduced when tungsten or generally LRM is eliminated from the second segment. Therefore, the first gate stack 112 for nFET with respective structures for the first segment with LRM in the isolation region 102D and the second segment without LRM in the inter-fin region 102C, both the threshold voltage and gate contact resistance are reduced, leading to the enhancement of the device performance. Similarly, the second gate stack 114 for pFET is also designed with enhanced device performance.

Figure 8:
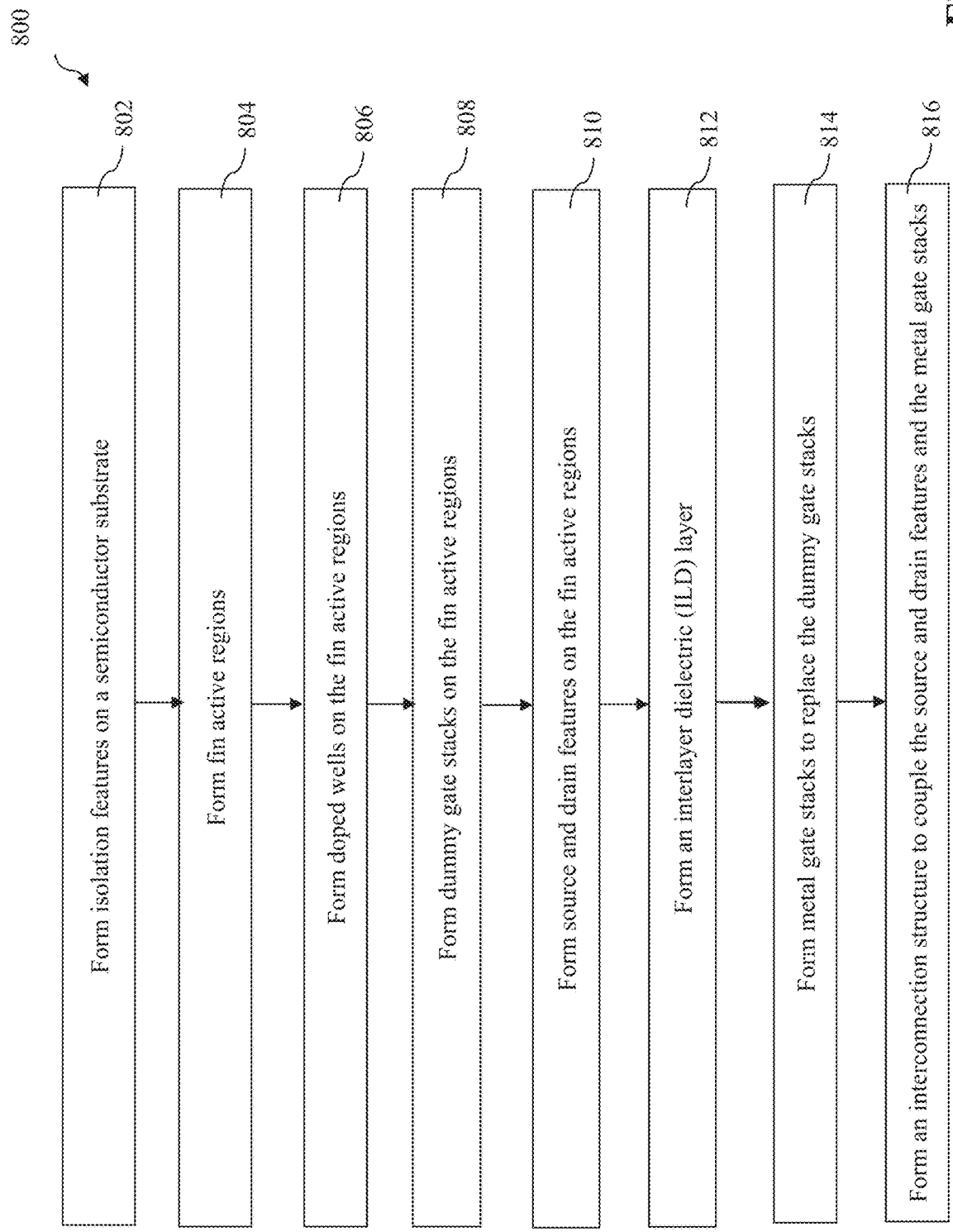
FIG. 8 is a flowchart of a method fabricating the semiconductor structure, in accordance with some embodiments.

FIG. 8 is a flowchart of the method 800 for making the semiconductor structure 100 having an nFET with the first gate stack 112 and a pFET with the second gate stack 114 of respective structures in the isolation regions and the inter-fin regions. The method 800 is described with reference to FIG. 8 and other figures. As some detailed description is provided with FIGS. 1A-1C and 2-7, those languages will not be repeated below.

Figure 10A:
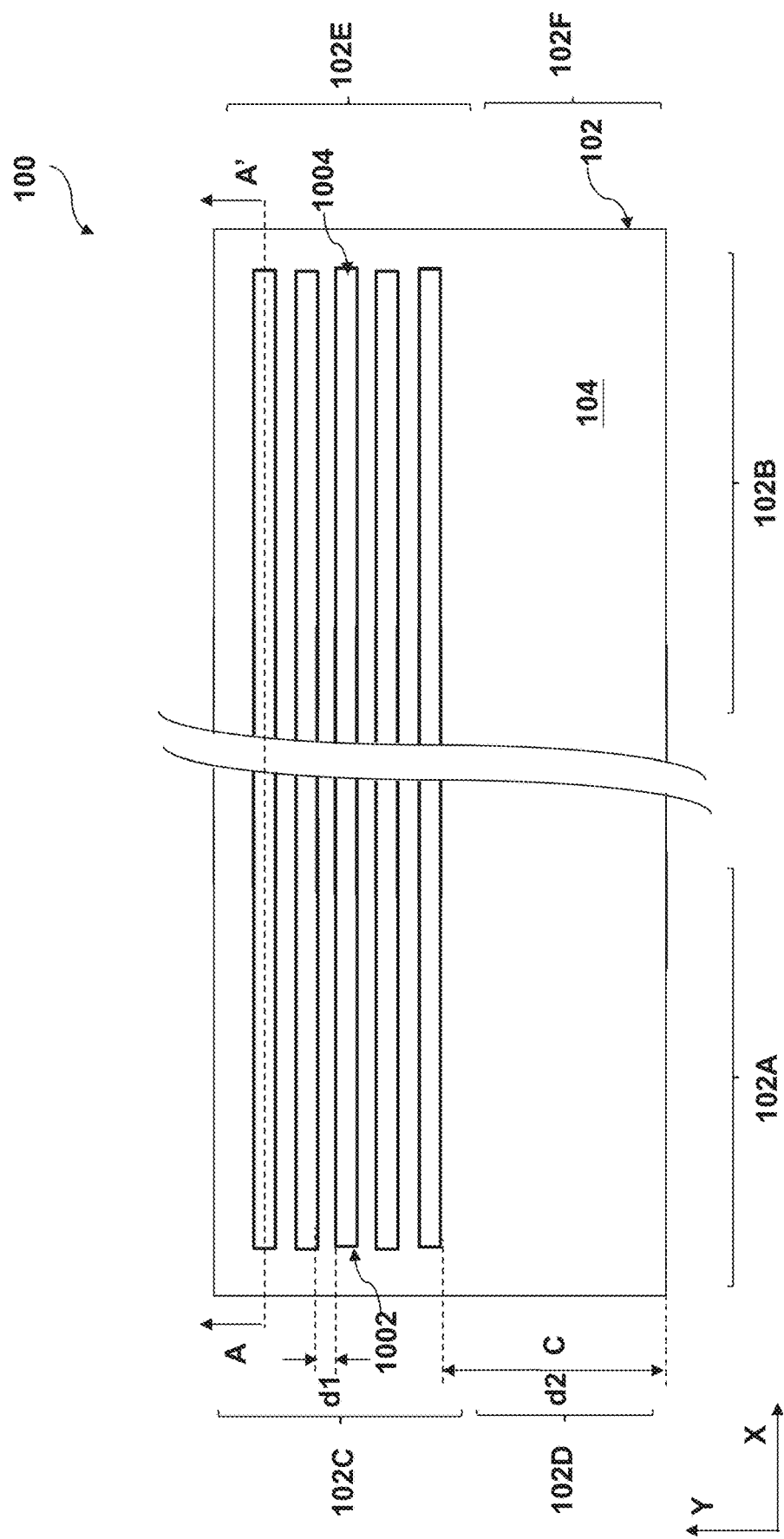
FIG. 10A is a top view of the semiconductor structure at a fabrication stage constructed according to various aspects of the present disclosure.
Figure 10B:
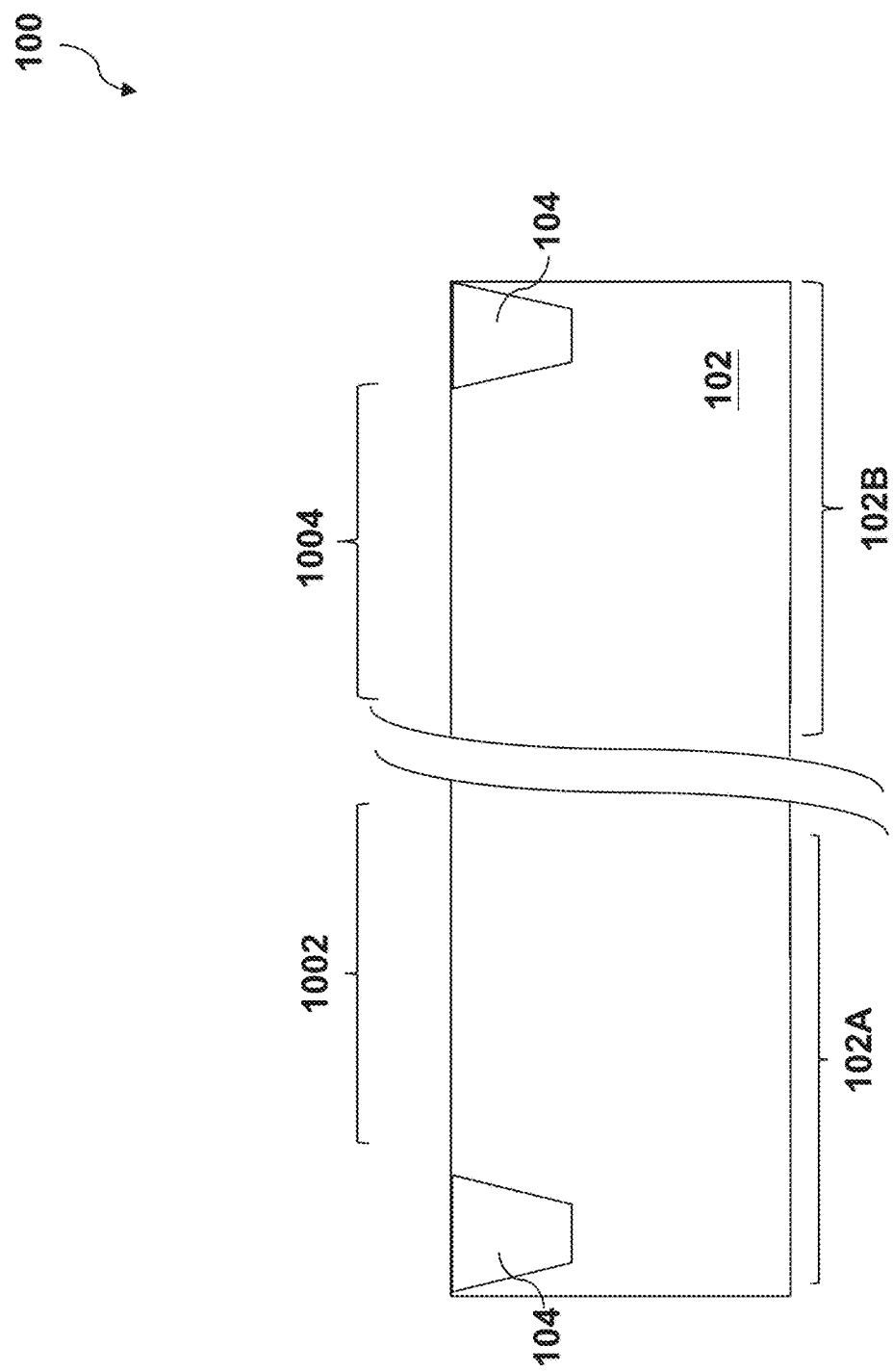
FIG. 10B is a sectional view of the semiconductor structure of FIG. 10A taken along the dashed line AA' constructed according to various aspects of the present disclosure.

Referring to block 802 of FIG. 8 and FIGS. 10A-10B, the method 800 includes an operation to form isolation features 104 in the semiconductor substrate 102, thereby defining a first active region 1002 in the first region 102A and a second active region 1004 in the second region 102B. FIG. 10A is a top view of the semiconductor structure 100; and FIG. 10B is a sectional view of the semiconductor structure 100 taken along the dashed line AA'. In the first region 102A, the first active regions 1002 are configured within an inter-fin region 102C with an adjacent isolation region 102D. Similarly, in the second region 102B, the second active regions 1004 are configured within an inter-fin region 102E with an adjacent isolation region 102F. The formation of the isolation features may include forming a patterned mask by lithography; etching the substrate 102 through the openings of the patterned mask to form trenches; filling the trench with one or more dielectric material; and performing a CMP process. The patterned mask includes openings to define the regions for the isolation features 104. The patterned mask layer may be a soft mask (such as a photoresist layer), or a hard mask (such as silicon oxide, silicon nitride or a combination thereof). The formation of the patterned hard mask may include depositing a hard mask layer, forming a patterned resist layer by a lithography process that further includes spin-on coating a resist layer, performing an exposure process, developing the exposed resist layer, etching the hard mask through the openings of the patterned resist layer, and removing the patterned resist layer by wet stripping or plasma ashing.

Figure 11A:
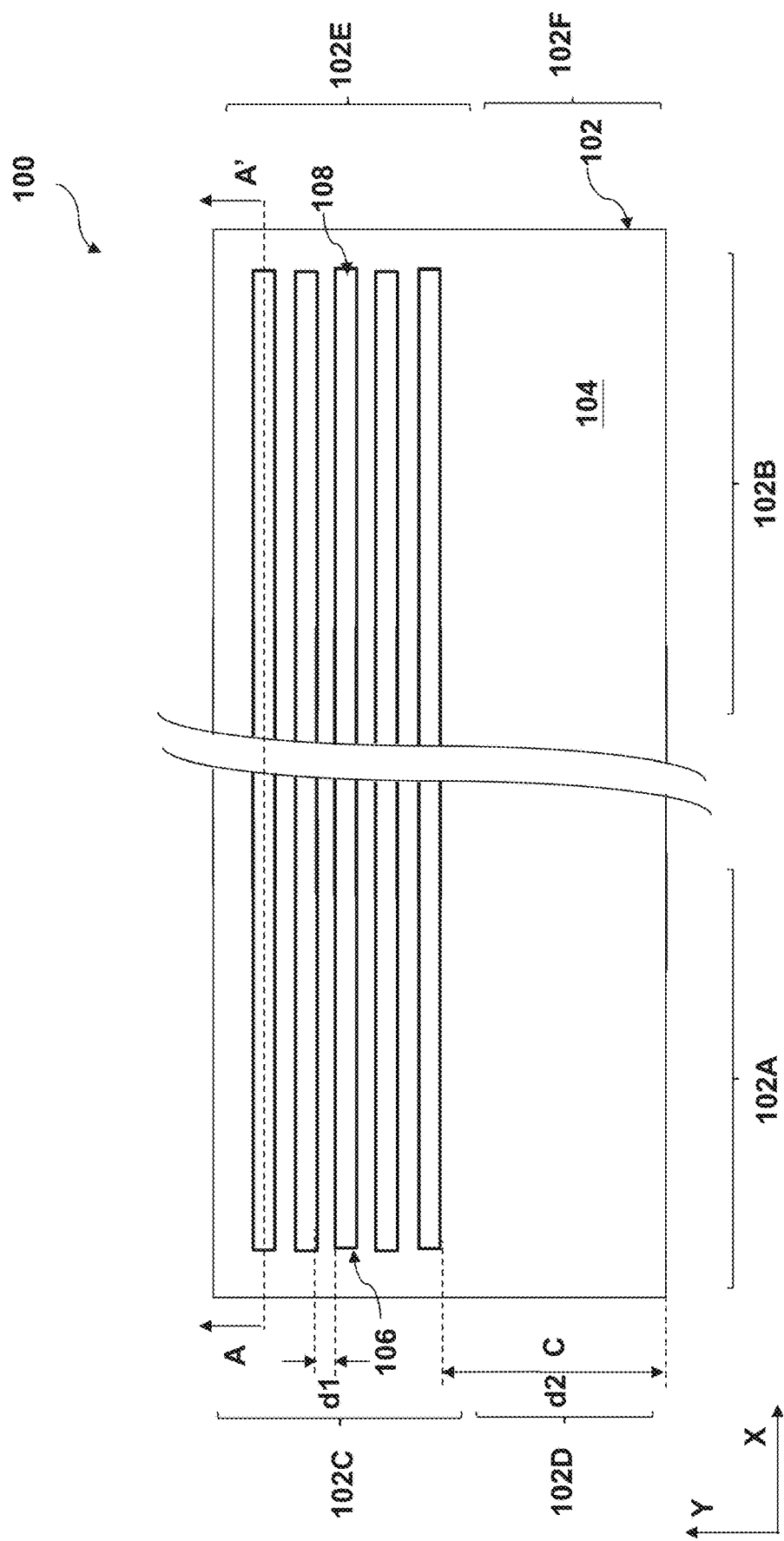
FIG. 11A is a top view of the semiconductor structure at a fabrication stage constructed according to various aspects of the present disclosure.
Figure 11B:
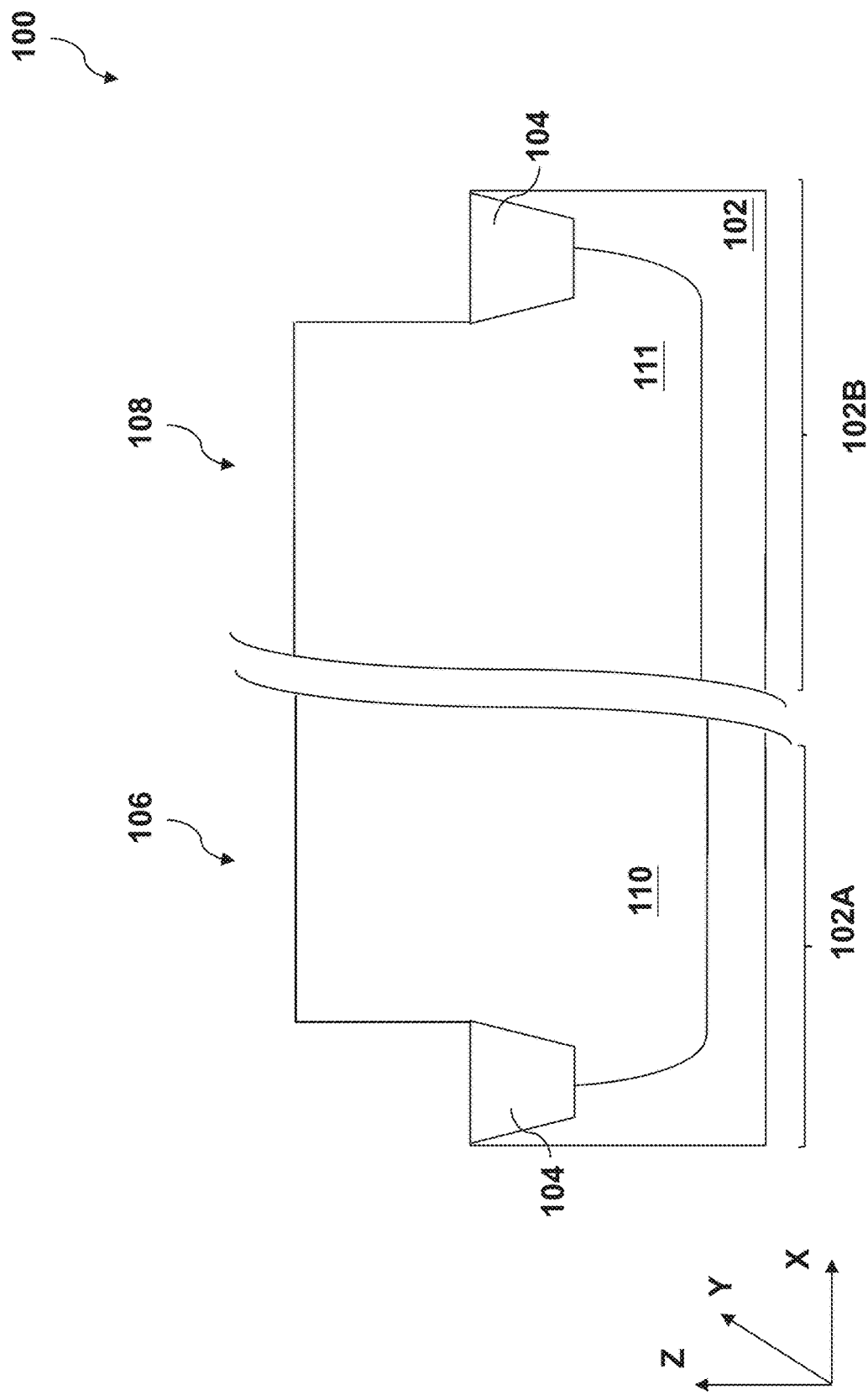
FIG. 11B is a sectional view of the semiconductor structure of FIG. 11A taken along the dashed line AA' constructed according to various aspects of the present disclosure.

Referring to block 804 of FIG. 8 and FIGS. 11A-11B, the method 800 further includes an operation to form first fin active regions (simply referred to as first fins) 106 and second fin active regions (simply referred to as second fins) 108 extruded above the isolation features 104. FIG. 11A is a top view of the semiconductor structure 100; and FIG. 11B is a sectional view of the semiconductor structure 100 taken along the dashed line AA'. Those fin active regions also collectively referred to as a fin structure. In some embodiments, the fin structure may be formed by selective etching to recess the isolation features 104. In some embodiments, the fin structure may be formed by selective epitaxial growth to the active regions with one or more semiconductor material. In yet some embodiments, the fin structure may be formed by a hybrid procedure having both selective etching to recess and selective epitaxial growth. The fin structure may have elongated shape oriented along the X direction. The epitaxial grown semiconductor material may include silicon, germanium, silicon germanium, silicon carbide or other suitable semiconductor material. The selective etching process may include wet etching, dry etching, other suitable etching or a combination thereof.

Referring to block 806 of FIG. 8 and FIGS. 11A-11B, the method 800 may include an operation to form doped wells, such as a doped well 110 on the first fins 106 within the first region 102A and the a doped well 111 on the second fins 108 within the second region 102B. In the present embodiment, the doped well 110 is a p-type doped well (p-well) where p-type dopant (such as boron) is introduced into the first fins 106 by a suitable technology, such ion implantation; and the doped well 111 is an n-type doped well (n-well) where n-type dopant (such as phosphorous) is introduced into the second fins 108 by a suitable technology.

Figure 12A:
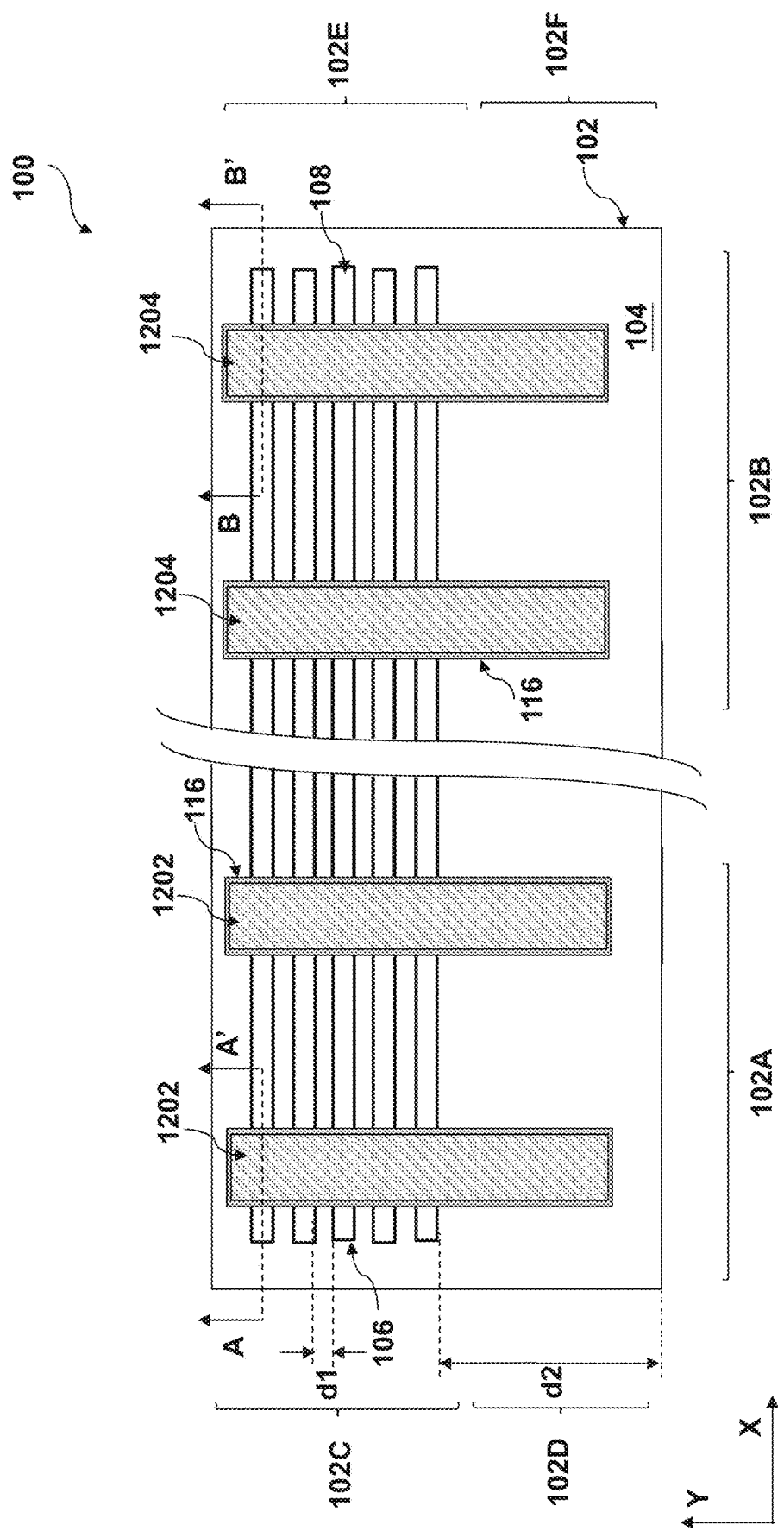
FIGS. 12A, 13A and 14A are top views of the semiconductor structure at various fabrication stages constructed according to various aspects of the present disclosure.
Figure 12B:
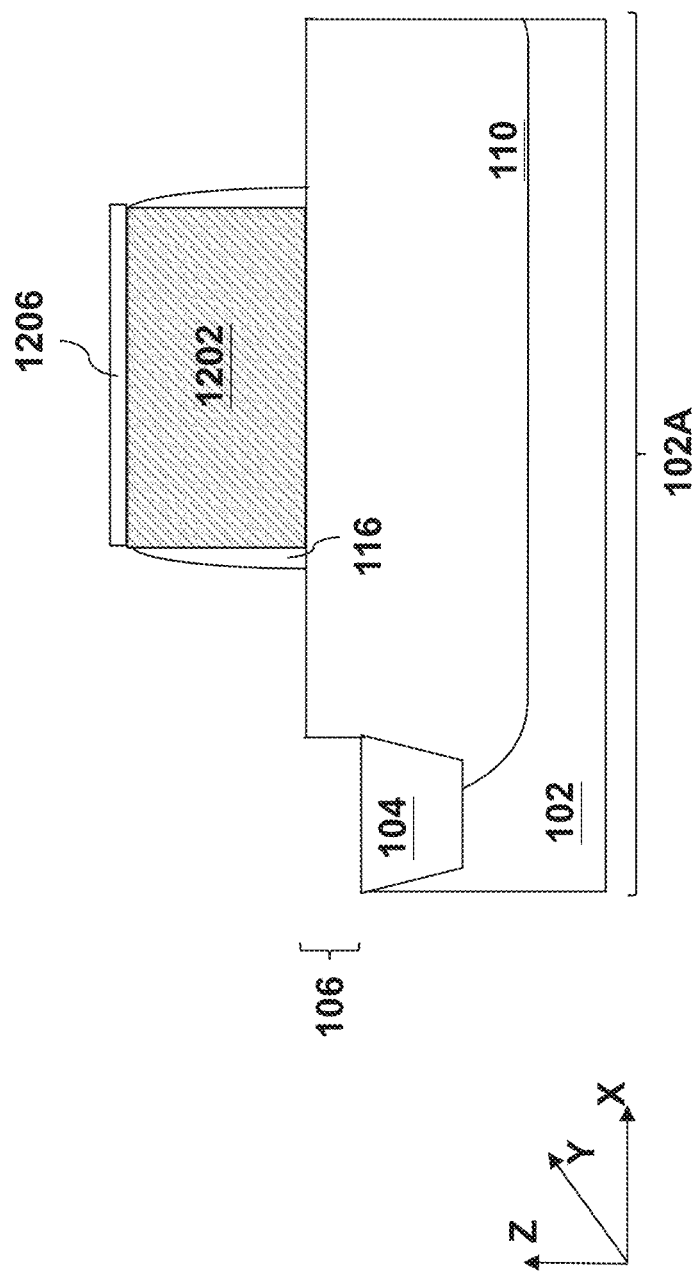
FIGS. 12B, 13B and 14B are sectional views of the semiconductor structure taken along the dashed line AA' at various fabrication stages, respectively, constructed according to various aspects of the present disclosure.
Figure 12C:
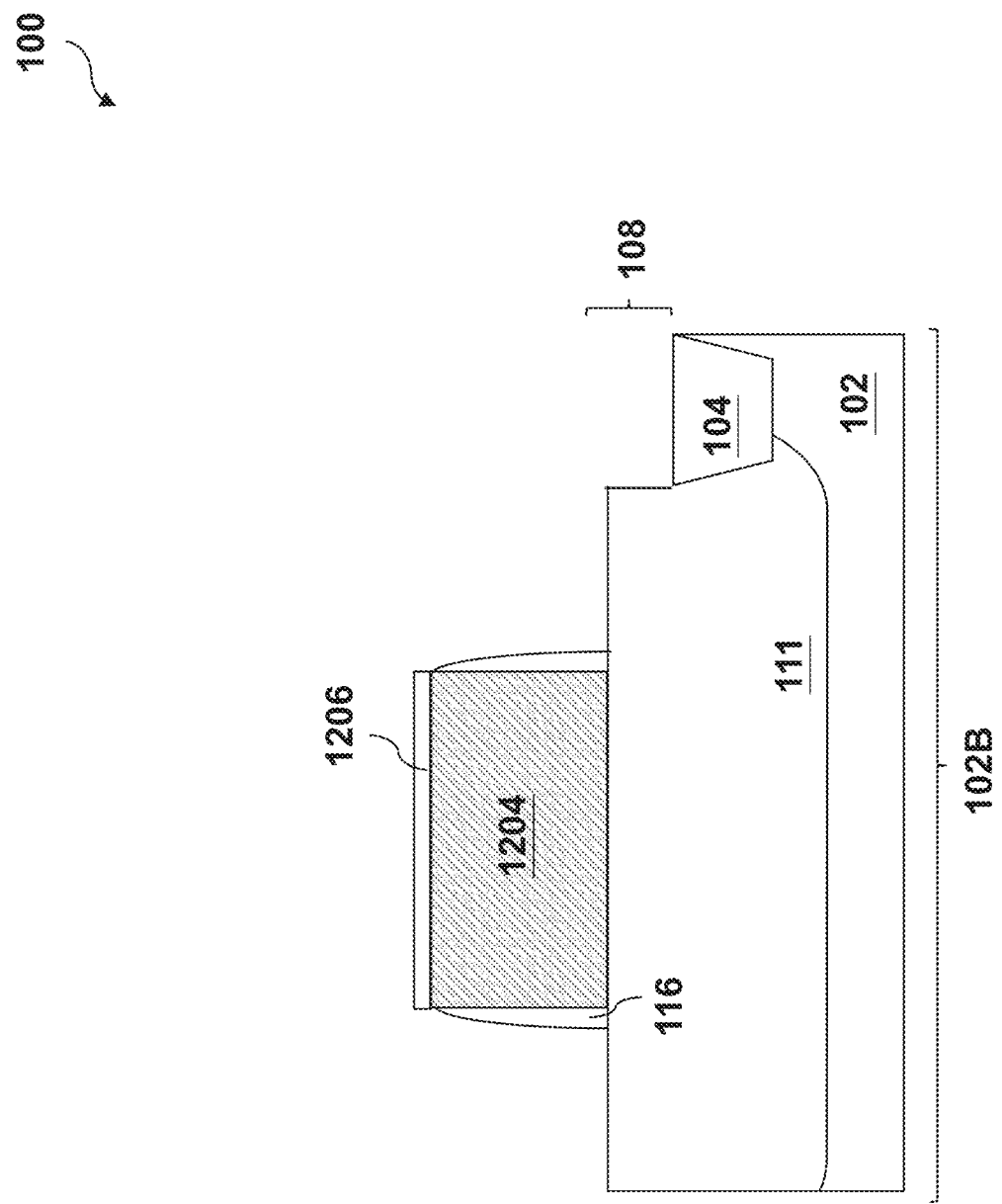
FIGS. 12C, 13C and 14C are sectional views of the semiconductor structure taken along the dashed line BB' at various fabrication stages, respectively, constructed according to various aspects of the present disclosure.

Referring to block 808 of FIG. 8 and FIGS. 12A-12C, the method 800 proceeds to an operation to form dummy gate stack on the substrate 102, such as first dummy gate stack(s) 1202 in the first region 102A and second dummy gate stack(s) 1204 in the second region 102B. FIG. 12A is a top view of the semiconductor structure 100; FIG. 12B is a sectional view of the semiconductor structure 100 in portion taken along the dashed line AA'; and FIG. 12C is a sectional view of the semiconductor structure 100 in portion taken along the dashed line BB', constructed in accordance with some aspects of the present disclosure. The dummy gate stacks 1202 and 1204 may include a gate dielectric layer, such as silicon oxide, high-k dielectric material, other suitable dielectric material, or a combination thereof. The dummy gate stacks 1202 and 1204 also include gate electrode of any suitable conductive material, such as doped poly-silicon. The dummy gate stacks 1202 and 1204 are formed by depositions and patterning process, which further includes lithography process and etching. In the present embodiment, the procedure to form the dummy gate stacks includes forming a thermal oxide layer on the fins by thermal oxidation; depositing a poly-silicon layer by CVD; forming a patterned mask layer 1206 by photolithography process; and performing an etching process to the deposited dummy gate materials. The patterned mask layer includes openings to define the regions for the first and second dummy gate stacks. The patterned mask layer 1206 may be a soft mask (such as a photoresist layer), or a hard mask (such as silicon oxide, silicon nitride or a combination thereof) formed with a similar processes to form the hard mask for the isolation features 104 during the operation 802.

During the operation 808, gate spacer 116 is also formed on sidewalls of the dummy gate stacks (1202 and 1204). The gate spacer 116 includes one or more dielectric material, such as silicon oxide or silicon nitride. The formation of the gate spacer 116 may include depositing one or more dielectric material layer on the dummy gate stacks; and performing an anisotropic etching process to the dielectric material layer. In some examples, the anisotropic etching process includes dry etching using a suitable etchant.

Figure 13A:
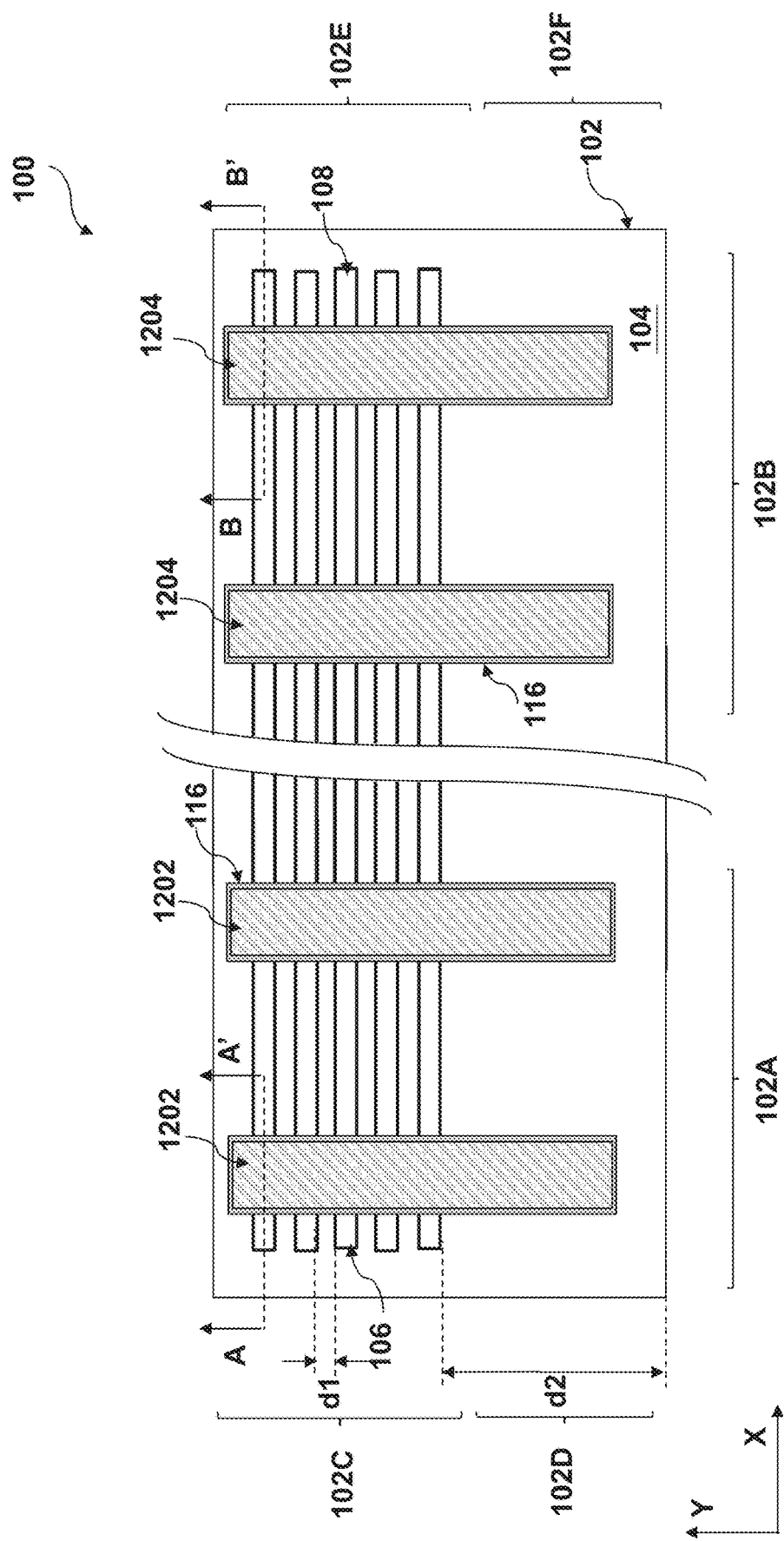
Figure 13B:
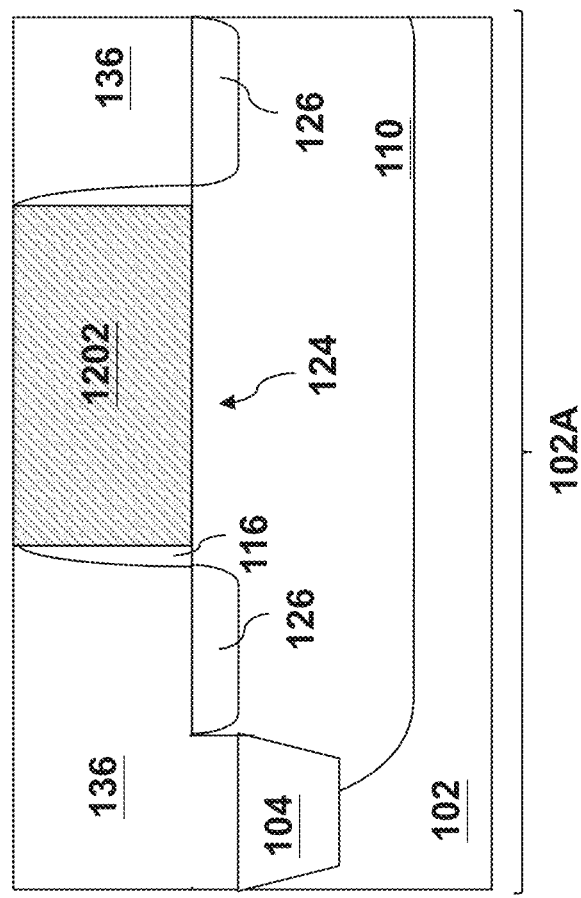
Figure 13C:
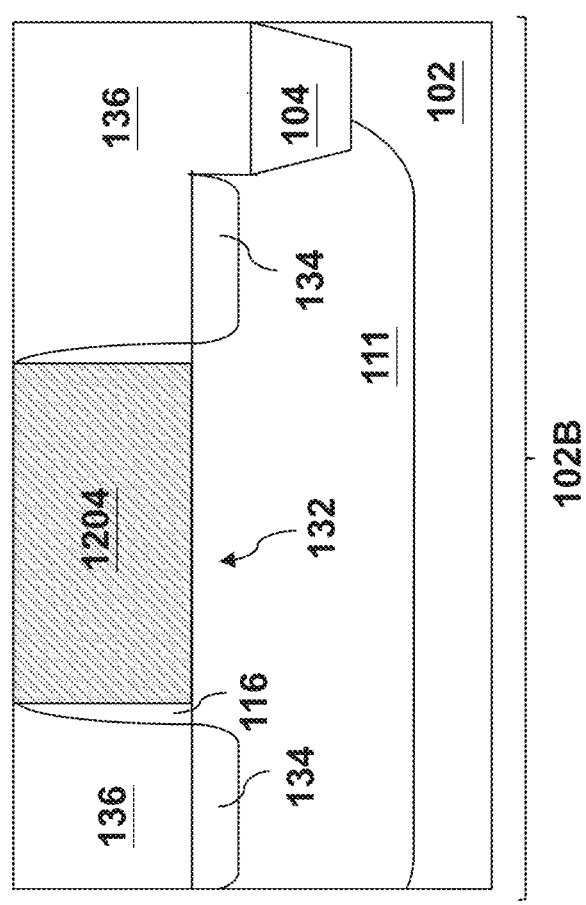

Referring to block 810 of FIG. 8 and FIGS. 13A-13C, the method 800 includes an operation to form various S/D features, such as S/D features 126 in the first region 102A and S/D features 134 in the second region 102B. FIG. 13A is a top view of the semiconductor structure 100; FIG. 13B is a sectional view of the semiconductor structure 100 in portion taken along the dashed line AA'; and FIG. 13C is a sectional view of the semiconductor structure 100 in portion taken along the dashed line BB', constructed in accordance with some aspects of the present disclosure. The S/D features 126 are interposed by the channel 124 underlying the gate stack 1202. The S/D features 126 are doped with an n-type dopant, such as phosphorous. The channel 124 is doped with a p-type dopant, such as boron. Similarly, the S/D features 134 are interposed by the channel 132 underlying the gate stack 1204. The S/D features 134 are doped with a p-type dopant, such as boron. The channel 132 is doped with an n-type dopant, such as phosphorous. The S/D features are formed by multiple steps and two types of source and drain features are formed separately.

In some embodiments, the source and drain are epitaxial source and drain. The epitaxial source and drain may be formed by selective epitaxial growth for straining effect with enhanced carrier mobility and device performance. The source and drain are formed by one or more epitaxial growth (epitaxial process), whereby silicon (Si) features, silicon germanium (SiGe) features, silicon carbide (SiC) features, and/or other suitable semiconductor features are grown in a crystalline state on the first active region within the source and drain regions (such as defined by a patterned hard mask). In an alternative embodiment, an etching process is applied to recess portions of the first active region 106 within the source and drain regions before the epitaxy growth. The etching process may also remove any dielectric material disposed on the source/drain regions, such as during the formation of the gate sidewall features. Suitable epitaxy processes include CVD deposition technologies (e.g., vapor-phase epitaxy (VPE) and/or ultra-high vacuum CVD (UHV-CVD), molecular beam epitaxy, and/or other suitable processes. The source and drain features may be in-situ doped during the epitaxy process by introducing doping species, such as n-type dopants (e.g., phosphorus or arsenic) for the S/D features 126, or p-type dopants (e.g., boron or $BF_2$) for the S/D features 134. If the source and drain are not in-situ doped, an implantation process (i.e., a junction implant process) is performed to introduce the corresponding dopant into the source and drain. In some other embodiments, the raised source and drain are formed by epitaxial growth with more than one semiconductor material layers. For example, a silicon germanium layer is epitaxially grown on the first fins 106 to form the S/D features 126; and a silicon layer or a silicon carbide is epitaxially grown on the second fins 108 to form the S/D features 134.

Referring to block 812 of FIG. 8 and FIGS. 13A-13C, the method 800 includes an operation to form an inter-layer dielectric (ILD) layer 136 on the semiconductor structure 100. The ILD layer 136 includes one or more dielectric material to provide isolation functions to various device components. The ILD layer 136 includes a dielectric material, such as silicon oxide, a low-k dielectric material, other suitable dielectric material, or a combination thereof. In some examples, the low-k dielectric material includes fluorinated silica glass (FSG), carbon doped silicon oxide, Xerogel, Aerogel, amorphous fluorinated carbon, Parylene, BCB (bis-benzocyclobutenes), SiLK (Dow Chemical, Midland, Mich.), polyimide, and/or other suitable dielectric materials with dielectric constant substantially less than that of the thermal silicon oxide. The formation of the ILD layer 136 includes deposition and CMP, for examples. The deposition may include spin-on coating, CVD, other suitable deposition technology or a combination thereof. The CMP process may stop on the hard mask 1206 using the hard mask as polishing stop layer and then the hard mask is removed by etching. Alternatively, the hard mask 1206 is removed by CMP as well. After the CMP, the dummy gate stacks are uncovered by the ILD layer 136.

Figure 9:
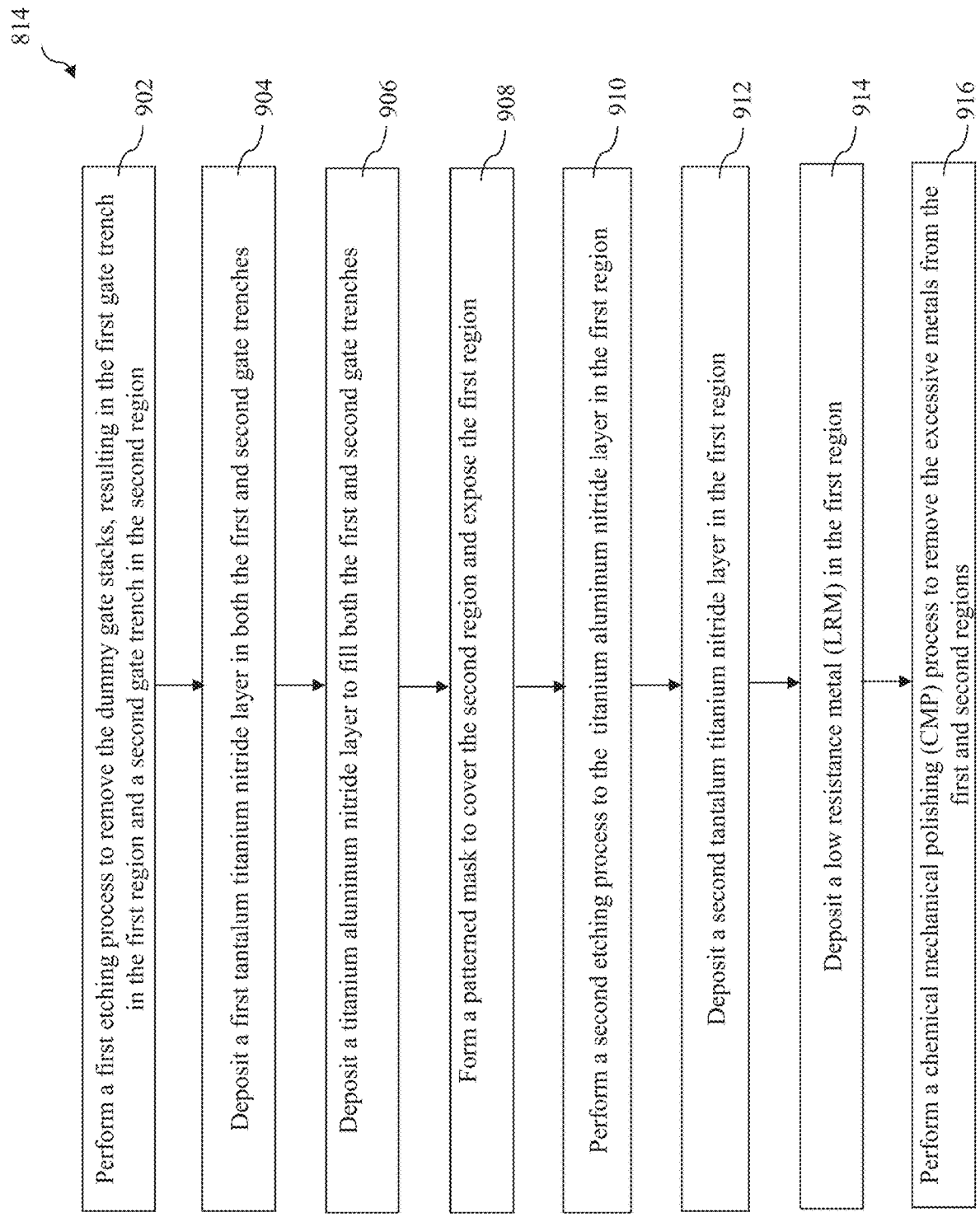
FIG. 9 is a flowchart of a method fabricating metal gate stacks of the semiconductor structure, in accordance with some embodiments.
Figure 14A:
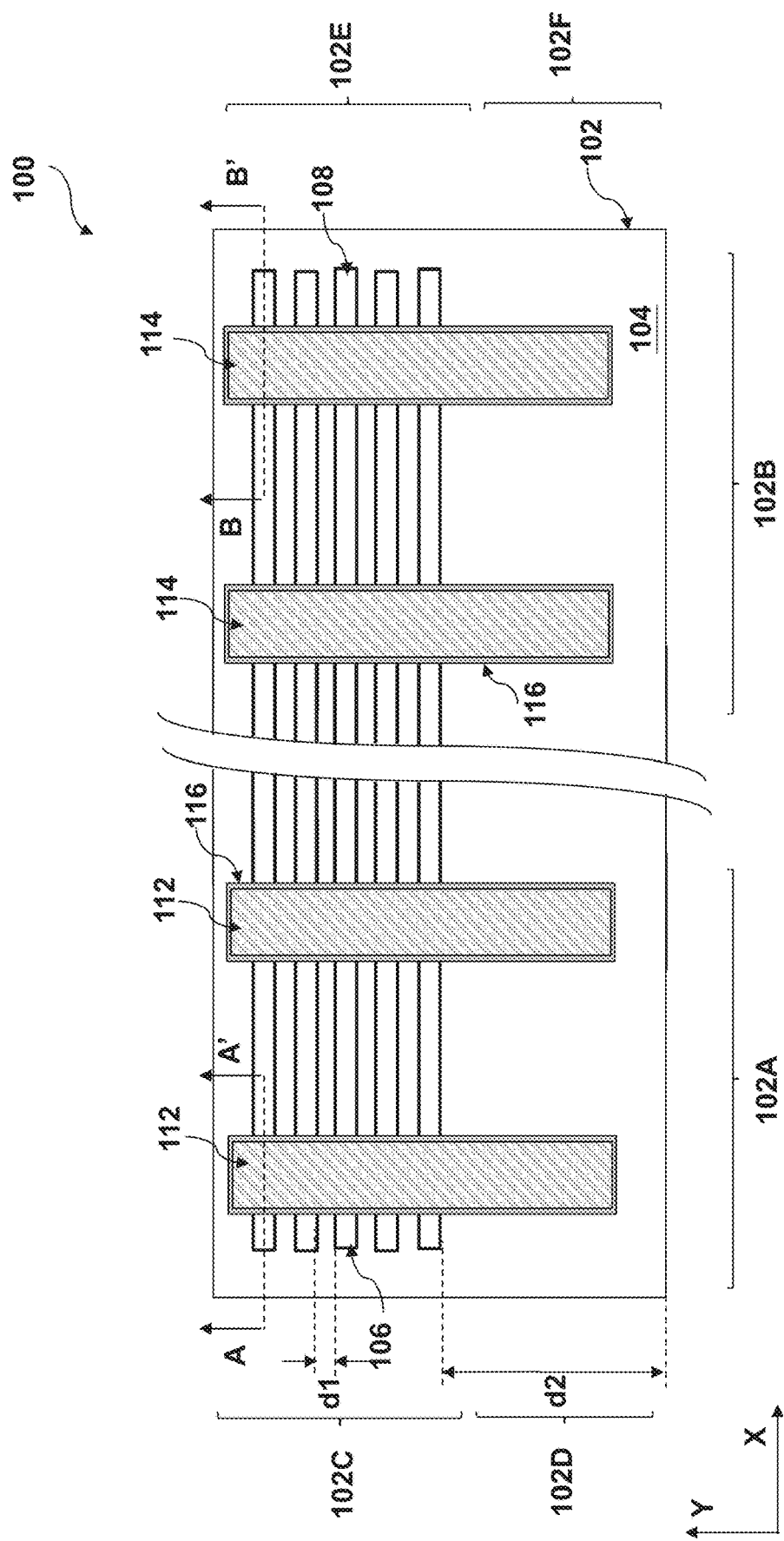
Figure 14B:
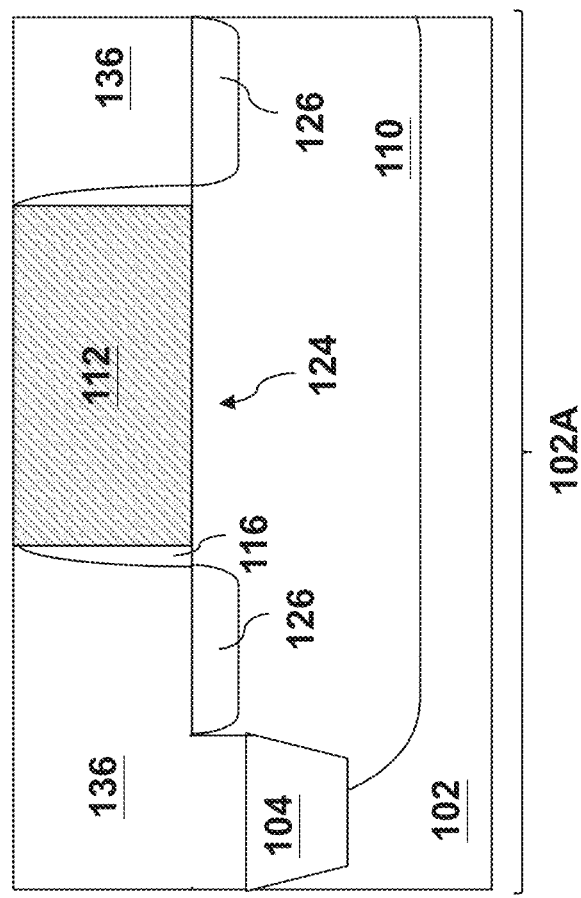
Figure 14C:
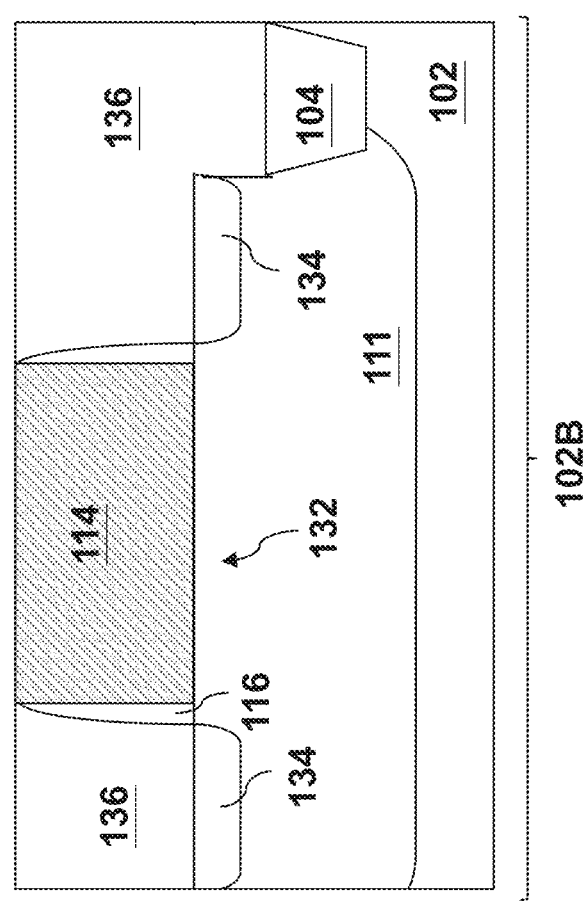

Referring to block 814 of FIG. 8 and FIGS. 14A-14C, the method 800 includes an operation to form metal gate stacks 112 and 114 to replace the dummy gate stacks 1202 and 1204, respectively. FIG. 14A is a top view of the semiconductor structure 100; FIG. 14B is a sectional view of the semiconductor structure 100 in portion taken along the dashed line AA'; and FIG. 14C is a sectional view of the semiconductor structure 100 in portion taken along the dashed line BB', constructed in accordance with some aspects of the present disclosure. The formation of the metal gate stacks includes etching, deposition and CMP. More detailed descriptions are provided with reference to FIG. 9 as a flowchart of the method 814.

Figure 15A:
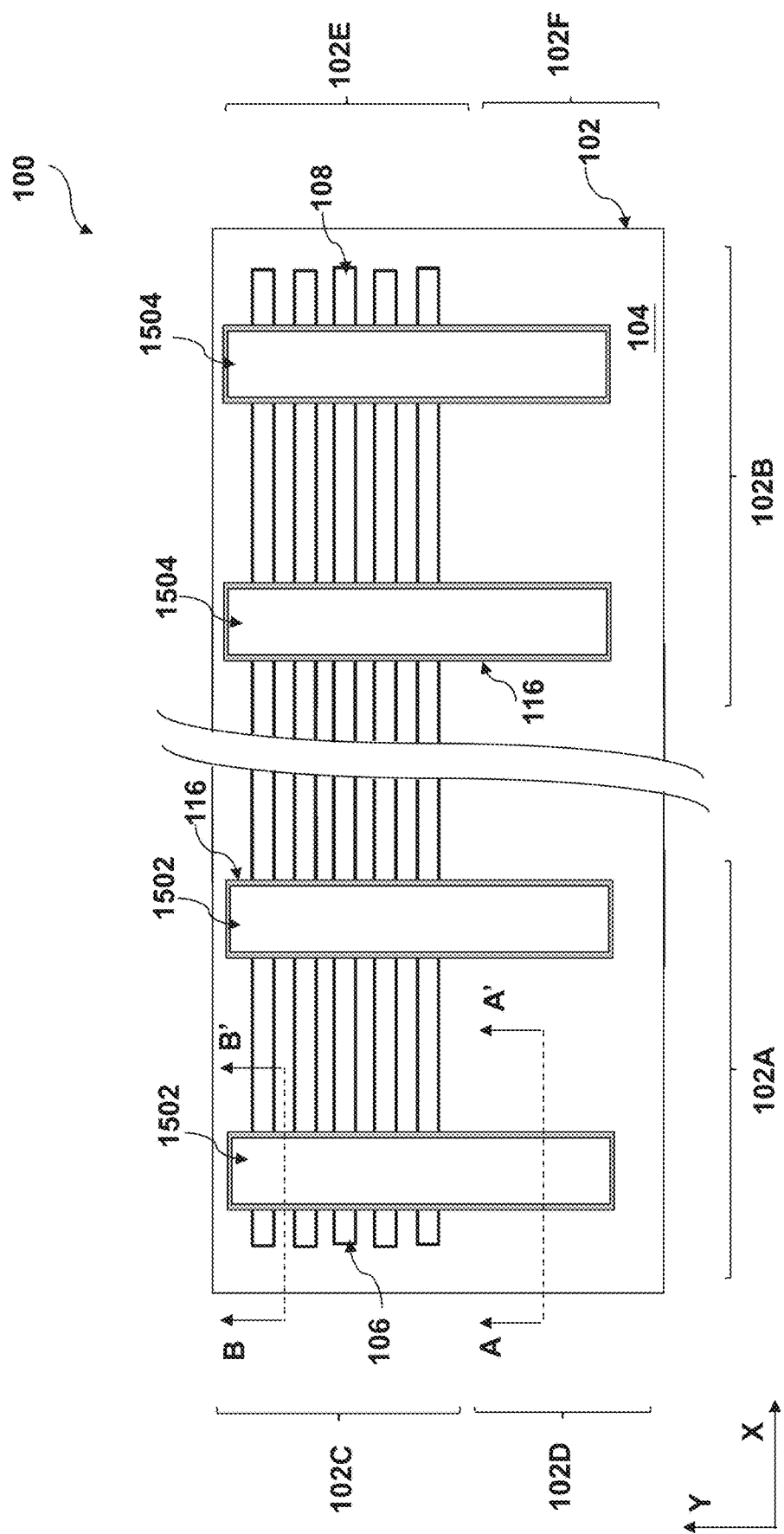
FIG. 15A is a top view of the semiconductor structure at a fabrication stage constructed according to various aspects of the present disclosure.
Figure 15C:
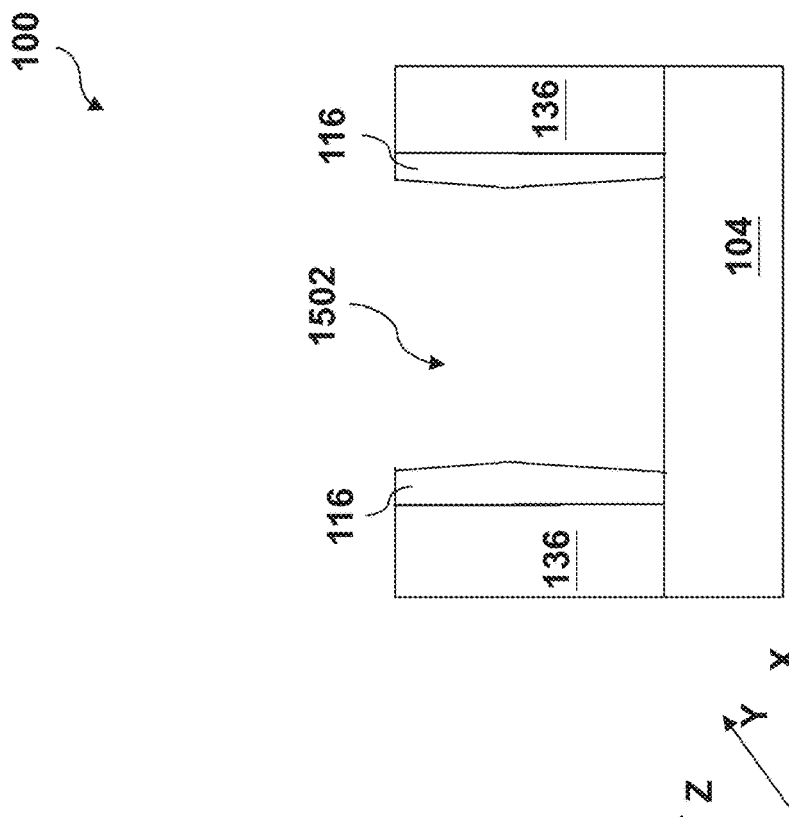
FIGS. 15B and 15C are sectional views of the semiconductor structure of FIG. 15A taken along the dashed lines AA' and BB', respectively, in accordance with some embodiments.
Figure 15B:
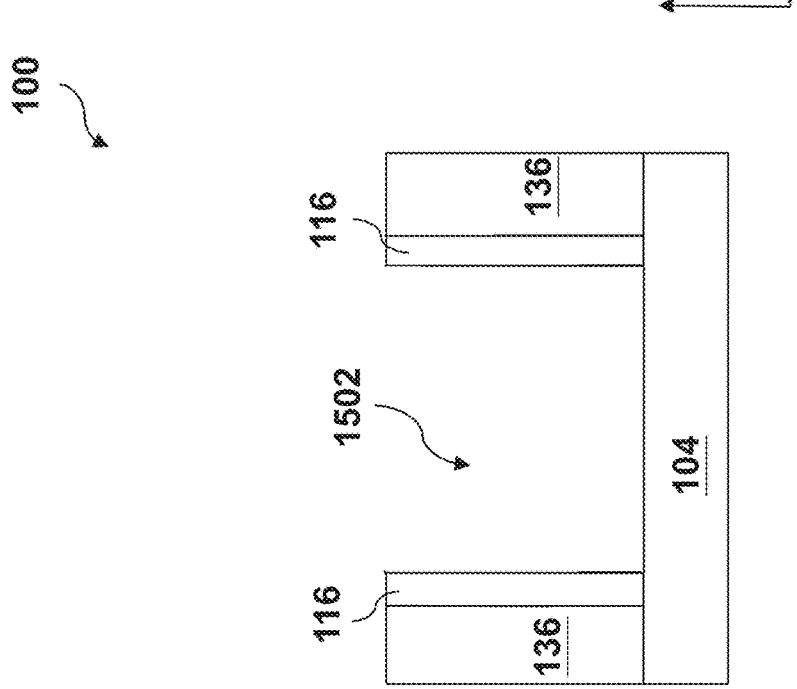

Referring to block 902 of FIG. 9 and FIGS. 15A-15C, the method 814 begins with an operation to perform a first etching process to remove the dummy gate stacks 1202 and 1204, resulting in gate trenches 1502 and 1504. FIG. 15A is a top view of the semiconductor structure 100; FIG. 15B is a sectional view of the semiconductor structure 100 in portion taken in the isolation region along the dashed line AA'; and FIG. 15C is a sectional view of the semiconductor structure 100 in portion taken in the inter-fin region along the dashed line BB', constructed in accordance with some aspects of the present disclosure. The first etching process includes one or more etching steps with suitable etchant and may include dry etching, wet etching or a combination thereof. For example, the wet etching may use hydrofluoric acid, or an ammonia-hydrogen peroxide-water mixture that is a solution including $NH_4OH$, $H_2O_2$ and $H_2O$. With etching loading effect, the segments of a dummy gate stack in the corresponding isolation region and inter-fin region have different etching characteristics. Taking the first dummy gate stack 1202 as an example, the segment of the dummy gate stack 1202 in the inter-fin region 102C, due to the high uneven profile in the inter-fin region 102C, the corresponding portion of the gate trench 1502 in the inter-fin region 102C has an uneven profile and a narrow wrist, as illustrated in FIG. 15C, while the portion of the gate trench 1502 in the isolation region 102D has a substantially vertical profile, as illustrated in FIG. 15B. In the second region 102B, the gate trench(s) 1504 also includes two portions in the isolation region 102F and the inter-fin region 102E, respectively, with similar structures.

Figure 16A:
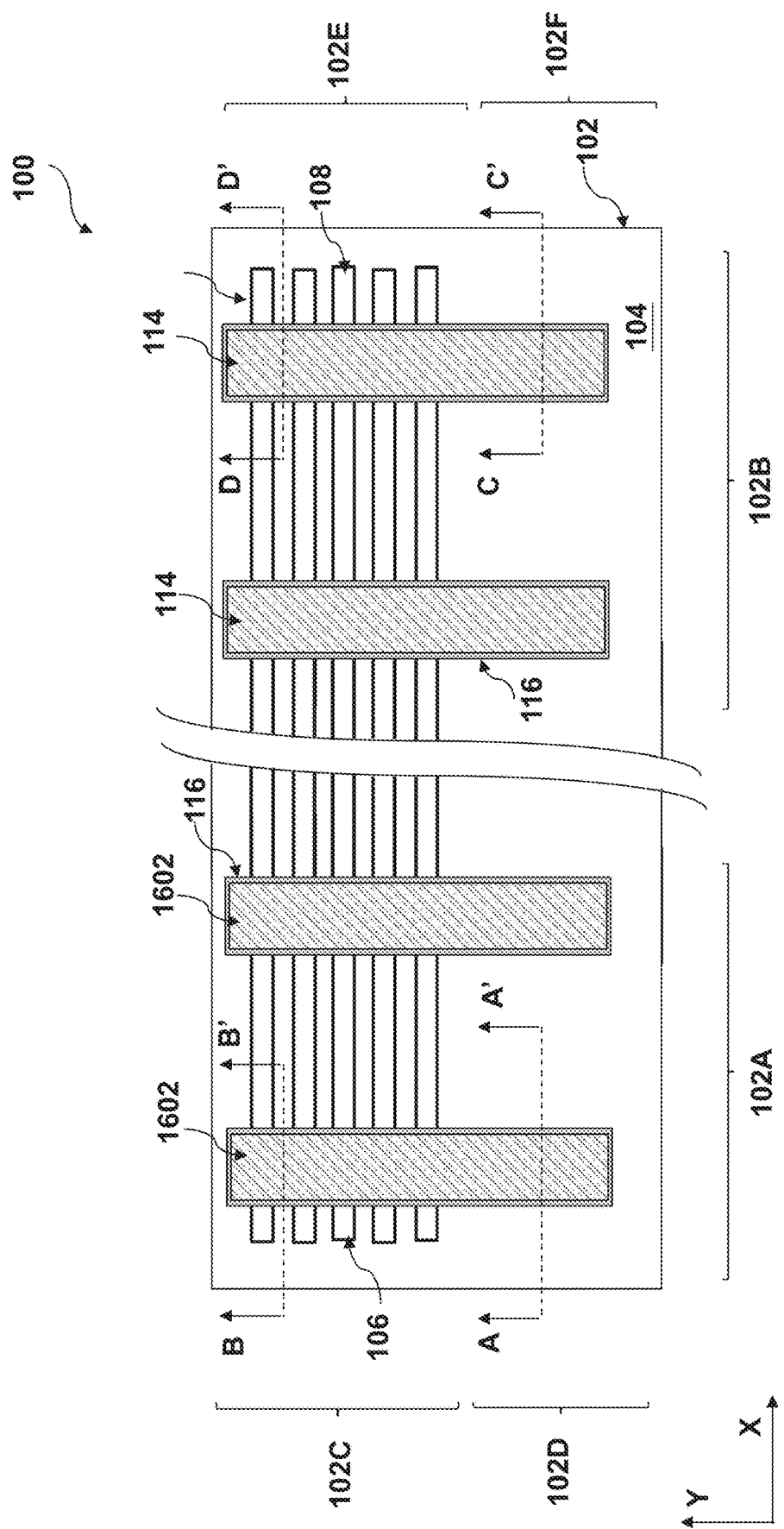
FIG. 16A is a top view of the semiconductor structure at a fabrication stage constructed according to various aspects of the present disclosure.
Figure 16C:
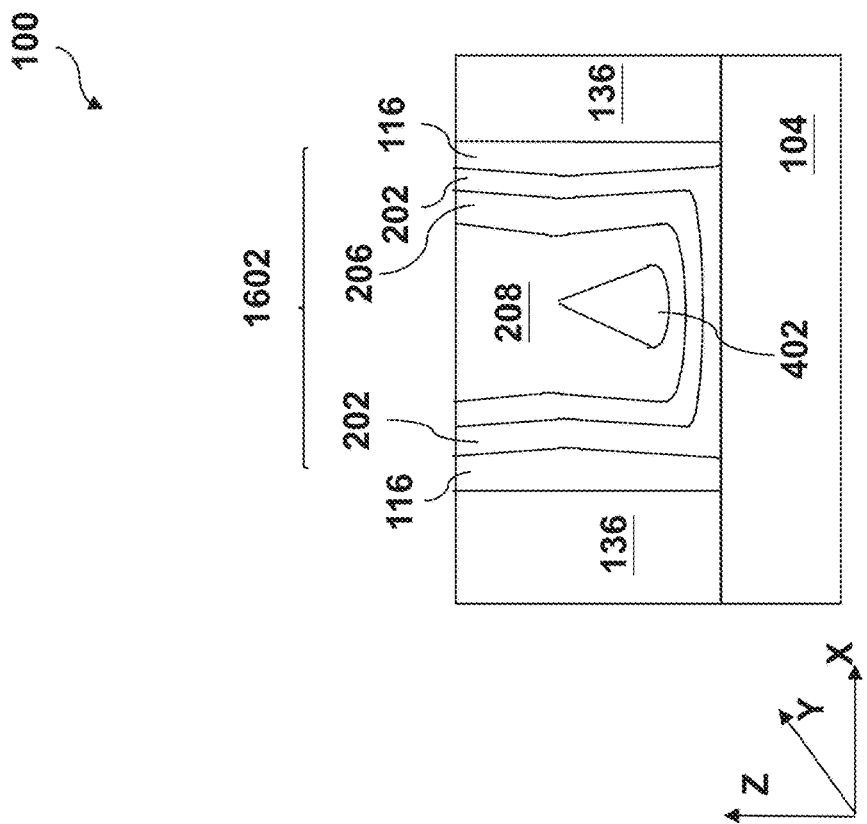
FIGS. 16B, 16C, 16D and 16E are sectional views of the semiconductor structure of FIG. 16A taken along the dashed lines AA', BB', CC' and DD', respectively, in accordance with some embodiments.
Figure 16B:
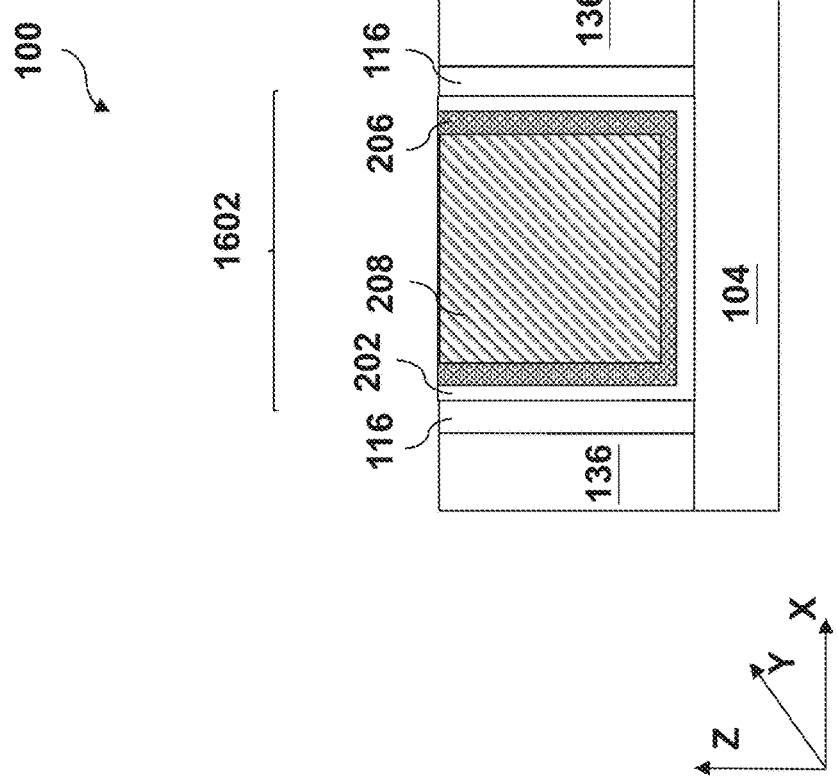
Figure 16E:
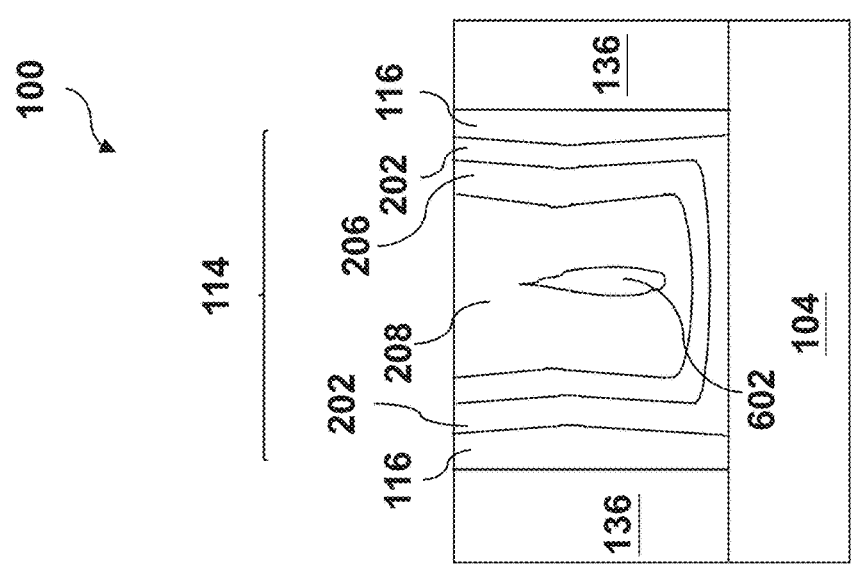
Figure 16D:
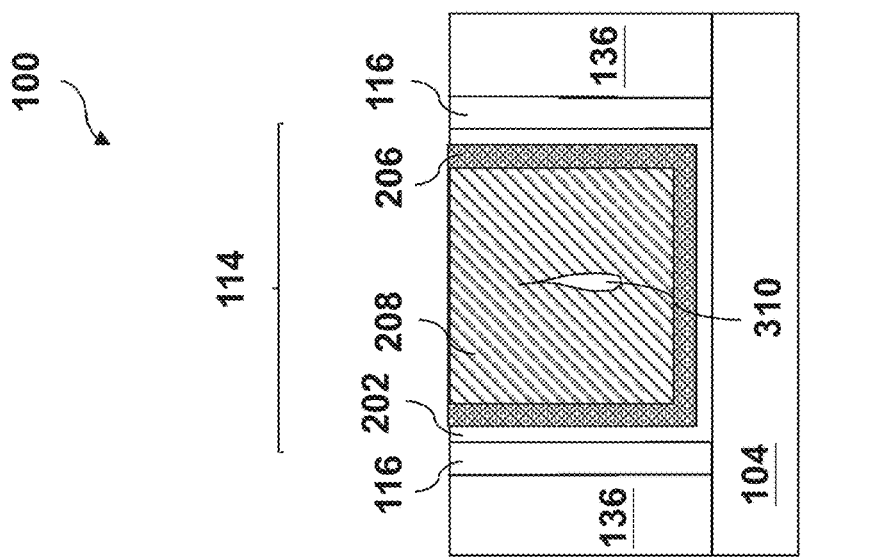

After the formation of the gate trenches 1502 and 1504, a gate dielectric layer 202 may be formed in the gate trenches by deposition, as illustrated in FIGS. 16A-16E. FIG. 16A is a top view of the semiconductor structure 100; FIG. 16B is a sectional view of the semiconductor structure 100 in portion taken in the isolation region 102D along the dashed line AA'; FIG. 16C is a sectional view of the semiconductor structure 100 in portion taken in the inter-fin region 102C along the dashed line BB', FIG. 16D is a sectional view of the semiconductor structure 100 in portion taken in the isolation region 102F along the dashed line CC'; and FIG. 16E is a sectional view of the semiconductor structure 100 in portion taken in the inter-fin region 102E along the dashed line DD', constructed in accordance with some aspects of the present disclosure. The gate dielectric layer 202 may include a high-k dielectric layer or may additionally include an interfacial layer, such as a silicon oxide layer. The gate dielectric layer 202 may be formed by a suitable technology including ALD, MOCVD, PVD, MBE, other suitable technology, or a combination thereof. In the present embodiment, the gate dielectric layer 202 is formed in a high-k-last process, and the gate dielectric layer 202 is U-shaped in the gate trenches 1502 and 1504, respectively.

Referring to block 904 of FIG. 9 and FIGS. 16A-16C, the method 814 proceeds to an operation to deposit a first tantalum titanium nitride layer 206 in the gate trenches 1502 and 1504 by a suitable method, such as PVD or other suitable deposition technology.

Referring to block 906 of FIG. 9 and FIGS. 16A-16E, the method 814 proceeds to an operation to deposit the titanium aluminum nitride layer 208 in the gate trenches 1502 and 1504 by a suitable method, such as PVD or other suitable deposition technology. The operation 906 is designed to substantially fill the trenches 1502 and 1504. It is noted that various material layers may be deposited on the ILD layer 136 even though FIGS. 16B-16E do not show. After the operation 906, the intermediate gate stack 1602 is formed in the first region 102A and the gate stack 114 is formed in the second region 102B. In the present embodiment, the intermediate gate stack 1602 includes an air gap defined in the titanium aluminum nitride layer 208, such as the air gap 402 in the inter-fin region 102C, which is caused by the narrow wrist profile and the deposition closes up before completely filling the gate trench. Similarly, the second gate stack 114 also includes an air gap 310 in the isolation region 102F and may further include an air gap 602 in the inter-fin region 102E.

Figure 17A:
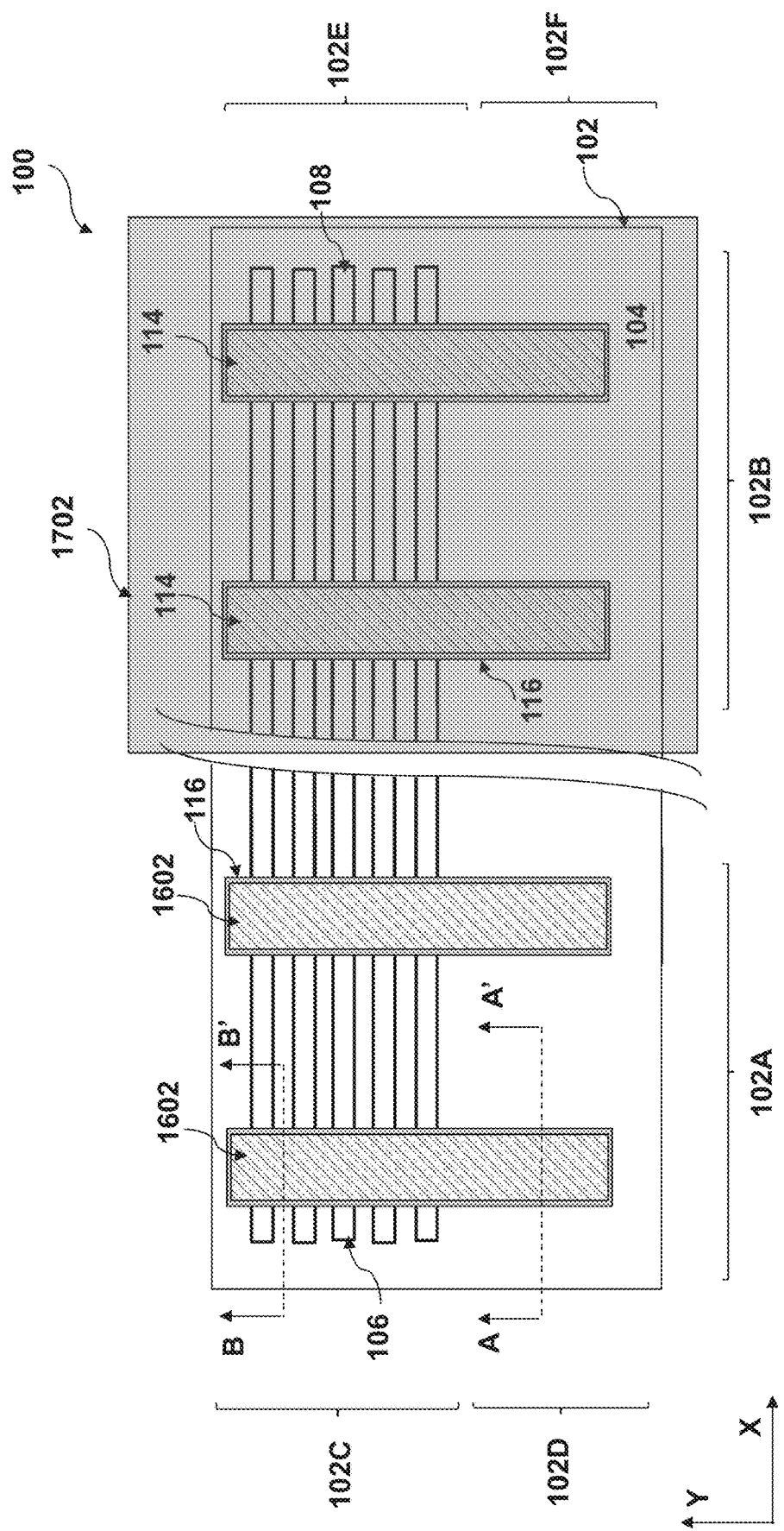
FIG. 17A is a top view of the semiconductor structure at a fabrication stage constructed according to various aspects of the present disclosure.
Figure 17C:
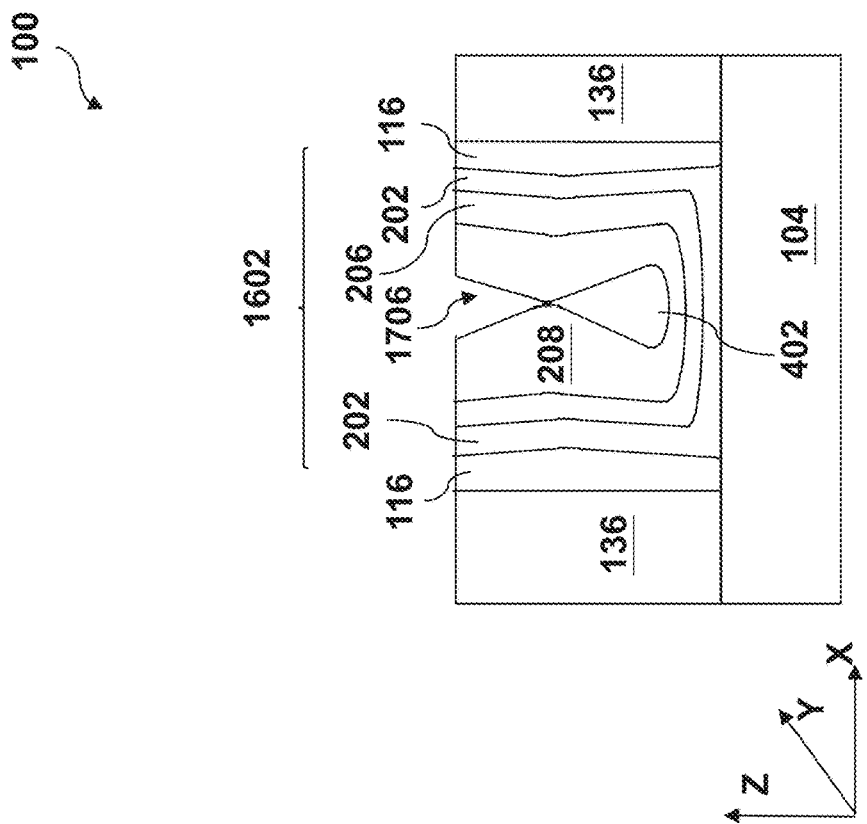
FIGS. 17B and 17C are sectional views of the semiconductor structure of FIG. 17A taken along the dashed lines AA' and BB', respectively, in accordance with some embodiments.
Figure 17B:
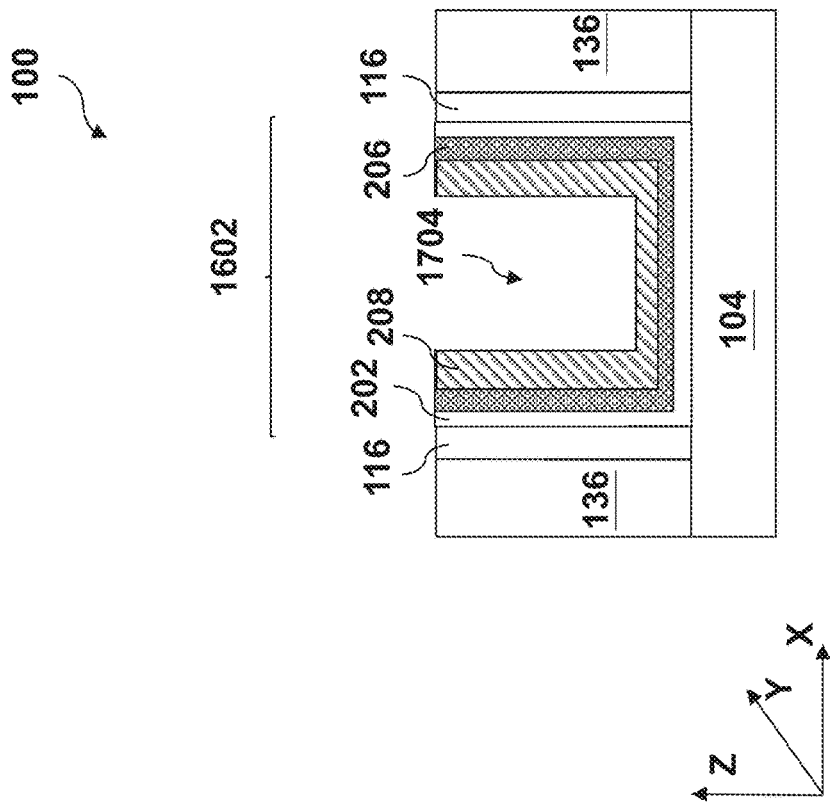

Referring to block 908 of FIG. 9 and FIGS. 17A-17C, the method 814 proceeds to an operation to form a patterned mask layer 1702 that covers the second region 102B and expose the first region 102A. FIG. 17A is a top view of the semiconductor structure 100; FIG. 17B is a sectional view of the semiconductor structure 100 in portion taken in the isolation region 102D along the dashed line AA'; and FIG. 17C is a sectional view of the semiconductor structure 100 in portion taken in the inter-fin region 102C along the dashed line BB', constructed in accordance with some aspects of the present disclosure. The patterned mask layer 1702 may be a soft mask, such as a patterned resist layer formed by a lithography process; or a patterned hard mask layer, such as a patterned silicon nitride layer formed by lithography process and etching.

Referring to block 910 of FIG. 9 and FIGS. 17A-17C, the method 814 proceeds to an operation to perform a second etching process to the semiconductor structure in the first region 102A while the second region 102B is protected by the patterned mask layer 1702. The second etching process may include wet etching, dry etching or other suitable etching technology with proper etchant to partially remove the titanium aluminum nitride layer 208 of the intermediate gate stack 1602 in the first region 102A, resulting in a trench 1704 in the isolation region 102D and a trench 1706 in the inter-fin region 102C. The patterned mask 1702 may be removed after the second etching process or may be removed at a later fabrication stage since the subsequent depositions will not impact the second gate stack 114 as it is already filled.

Figure 18A:
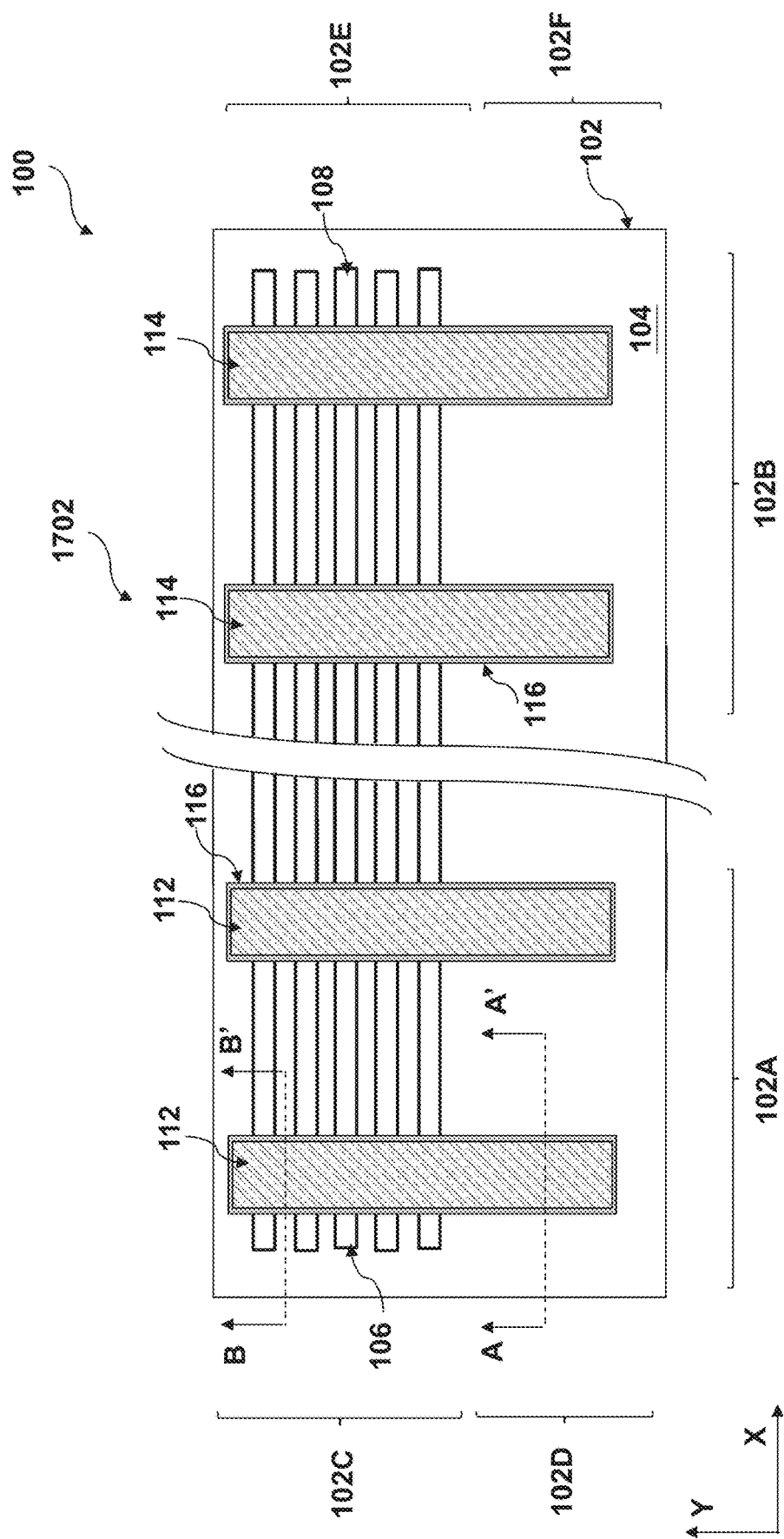
FIG. 18A is a top view of the semiconductor structure at a fabrication stage constructed according to various aspects of the present disclosure.
Figure 18C:
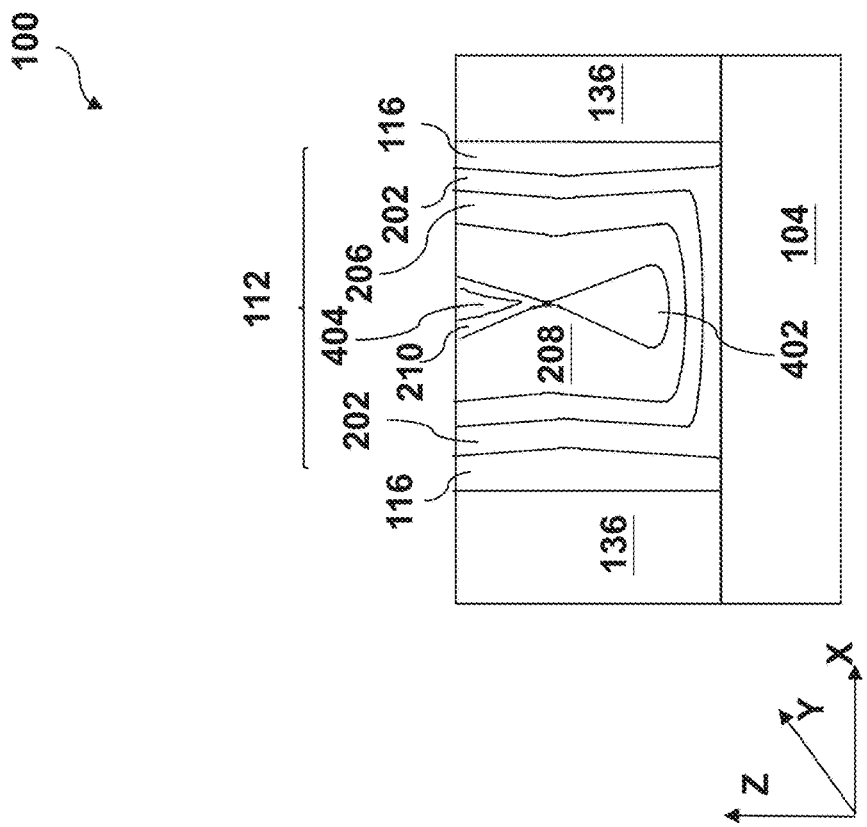
FIGS. 18B and 18C are sectional views of the semiconductor structure of FIG. 18A taken along the dashed lines AA' and BB', respectively, in accordance with some embodiments.
Figure 18B:
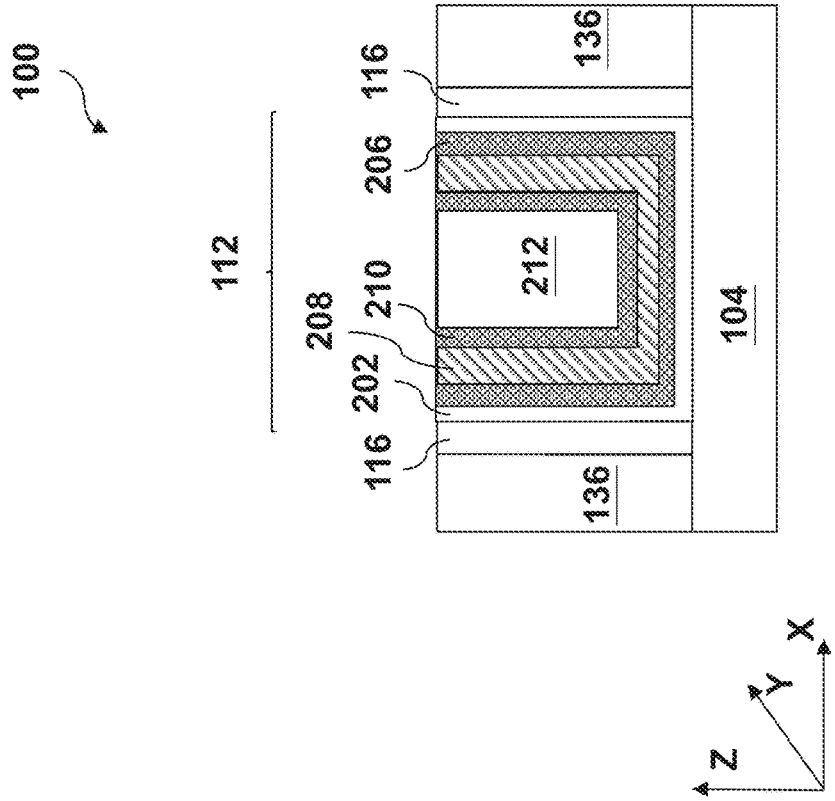

Referring to block 912 of FIG. 9 and FIGS. 18A-18C, the method 814 proceeds to an operation to deposit a second tantalum titanium nitride layer 210 in the trenches 1704 and 1706 by a suitable method, such as PVD or other suitable deposition technology. FIG. 18A is a top view of the semiconductor structure 100; FIG. 18B is a sectional view of the semiconductor structure 100 in portion taken in the isolation region 102D along the dashed line AA'; and FIG. 18C is a sectional view of the semiconductor structure 100 in portion taken in the inter-fin region 102C along the dashed line BB', constructed in accordance with some aspects of the present disclosure.

Referring to block 914 of FIG. 9 and FIGS. 18A-18C, the method 814 proceeds to an operation to deposit a LRM layer 212 in the first region 102A by a suitable method, such as PVD or other suitable deposition technology. In some embodiments, the LRM layer 212 includes tungsten, copper, aluminum, aluminum copper alloy, a combination thereof. The LRM layer 212 completely fills in the segment of the first gate stack 112 in the isolation region 102D and substantially fills in the segment of the first gate stack 112 in the inter-fin region 102C, which may leave a void 404 on the top portion.

Referring to block 916 of FIG. 9 and FIGS. 18A-18C, the method 814 proceeds to an operation to perform a CMP process to remove the excessive portions of the deposited materials and planarize the top surface of the semiconductor structure 100. The CMP process completely removes the deposited materials on the ILD layer 136. The patterned mask layer 1702 may be additionally removed by the CMP process or be alternatively removed by another etching process if the patterned mask layer 1702 is not removed previously. Thus, the first metal gate stack 112 and the second metal gate stack 114 are both formed with respective structures as described above.

Now referring back to FIG. 8, the method 800 may additionally include other operations before, during or after the operations described above. For example, the method 800 may include an operation 816 to form an interconnection structure to couple various features of the nFET, pFET and various other devices into an integrated circuit. The interconnection structure includes multiple metal layers with metal lines for horizontal connection and further includes via features for vertical connection between adjacent metal layers. The interconnection structure further includes dielectric material(s), such ILD to provide isolation functions to various conductive features embedded therein. In the present example for illustration, the interconnection structure may be formed by a suitable technology, such as single damascene process, dual damascene process or other suitable process. Various conductive features (contact features, via features and metal lines) may include copper, aluminum, tungsten, silicide, other suitable conductive material or combinations thereof. The ILD may include silicon oxide, low-k dielectric material, other suitable dielectric material or a combination thereof. The ILD may include multiple layers, each further including an etch stop layer (such as silicon nitride) to provide etch selectivity. Various conductive features may further include lining layers, such as titanium nitride and titanium, to provide barrier to prevent inter-diffusion, adhesion or other material integration effects.

The present disclosure provides a semiconductor structure having nFET and pFET with respective gate structure and a method making the same. Especially, the gate stack for the nFETs has a first segment in the isolation region and a second segment in the inter-fin region, wherein the first segment includes a LRM while the second segment is free of the LRM. As the gate contact is disposed and is landing on the first segment of the nFET gate, the contact resistance between the gate electrode and the gate contact is substantially reduced. The second segment of the nFET gate is disposed on the fins and is overlying the channel region of the corresponding nFET, the work function of the metal compositions of the gate electrode will have impact to the threshold voltage of the corresponding nFET. Without the LRM in the second segment, the threshold voltage of the corresponding nFET is reduced. Those structures of the nFET gate reduce both the threshold voltage and the contact resistance, therefore enhancing the device performance. Furthermore, the disclosed structure and method are compatible with advanced technologies with smaller feature sizes, such as the advanced technology of 7 nm.

Thus, the present disclosure provides a semiconductor structure in accordance with some embodiments. The semiconductor structure includes a semiconductor substrate having a first region and a second region being adjacent to the first region; first fins formed on the semiconductor substrate within the first region; a first shallow trench isolation (STI) feature disposed on the semiconductor substrate within the second region; and a first gate stack that includes a first segment disposed directly on the first fins within the first region and a second segment extending to the first STI feature within the second region. The second segment of the first gate stack includes a first tantalum titanium nitride layer, a titanium aluminum nitride layer, a second tantalum titanium nitride layer, and a low resistance metal (LRM) layer stacked in sequence. The first segment of the first gate stack within the first region is free of the LRM layer.

The present disclosure provides a semiconductor structure in accordance with some other embodiments. The semiconductor structure includes a semiconductor substrate having a first region and a second region; first fins disposed on the semiconductor substrate within the first region and second fins disposed on the semiconductor substrate within the second region; a first gate stack disposed directly on the first fins, wherein the first gate stack includes a first tantalum titanium nitride layer, a titanium aluminum nitride layer, a second tantalum titanium nitride layer, and a low resistance metal (LRM) in sequence; and a second gate stack disposed directly on the second fins, wherein the second gate stack is free of the LRM and includes the first tantalum titanium nitride layer and the titanium aluminum nitride layer, wherein the LRM includes at least one of tungsten, copper, aluminum, and copper aluminum alloy.

The present disclosure provides a method in accordance with some embodiments. The method includes forming isolation features in a semiconductor substrate, defining first fins in a first region and second fins in a second region; forming a first dummy gate stack on the first fins and a second dummy gate stack on the second fins; depositing an inter-layer dielectric (ILD) layer on the substrate; removing the first and second dummy gate stacks by an etching process, resulting a first gate trench and a second gate trench in the ILD layer; depositing a first tantalum titanium nitride layer in the first and second gate trenches; depositing a titanium aluminum nitride layer on the first tantalum titanium nitride layer to fill in the first and second gate trench; forming a patterned mask to cover the second region and uncover the first region; performing an etching process to the titanium aluminum nitride layer in the first gate trench; depositing a second tantalum titanium nitride layer in the first gate trench; and filling a low resistance metal in the first gate trench.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A method, comprising:
  forming isolation features in a semiconductor substrate, defining first fins in a first region and second fins in a second region;

forming a first dummy gate stack on the first fins and a second dummy gate stack on the second fins;
depositing an inter-layer dielectric (ILD) layer on the substrate;
removing the first and second dummy gate stacks by an etching process, resulting a first gate trench and a second gate trench in the ILD layer;
depositing a first tantalum titanium nitride layer in the first and second gate trenches;
depositing a titanium aluminum nitride layer on the first tantalum titanium nitride layer to fill in the first and second gate trench;
forming a patterned mask to cover the second region and uncover the first region;
performing an etching process to the titanium aluminum nitride layer in the first gate trench;
depositing a second tantalum titanium nitride layer in the first gate trench; and
filling a low resistance metal in the first gate trench, wherein a first gate stack is formed in the first gate trench and a second gate stack is formed in the second gate trench.

2. The method of claim 1, wherein the filling the low resistance metal layer in the first gate trench includes depositing one of tungsten, copper, aluminum, copper aluminum alloy and a combination thereof.

3. The method of claim 2, wherein the performing of the etching process to the titanium aluminum nitride layer in the first gate trench includes partially removes the titanium aluminum nitride layer in the first gate trench.

4. The method of claim 3, prior to the depositing of the first tantalum titanium nitride layer, further comprising depositing a high-k dielectric material layer in the first and second gate trenches.

5. The method of claim 4, wherein the first gate stack includes a first segment on the first fin active region and a second segment being extended from the first fin active region onto a shallow trench isolation (STI) feature.

6. The method of claim 5, wherein the second segment of the first gate stack includes the first and second tantalum titanium nitride layers with the titanium aluminum nitride layer interposed therebetween.

7. The method of claim 6, wherein the first segment of the first gate stack defines a first air gap surrounded by the second tantalum titanium nitride layer while the second segment is free of void.

8. The method of claim 7, wherein the second gate stack includes a third segment on the second fin active region and a fourth segment being extended from the second fin active region onto the STI feature.

9. The method of claim 8, wherein the fourth segment of the second gate stack defines a second air gap surrounded by the first tantalum titanium nitride layer and the third segment of the second gate stack defines a third air gap surrounded by the first tantalum titanium nitride layer.

10. The method of claim 9, wherein the third air gap in the third segment of the second gate stack has a volume being greater than a volume of the second air gap in the fourth segment of the second gate stack.

11. A method, comprising:
forming isolation features in a semiconductor substrate, defining first fins in a first region and second fins in a second region;
forming a first dummy gate stack on the first fins and a second dummy gate stack on the second fins;
depositing an inter-layer dielectric (ILD) layer on the substrate;
removing the first and second dummy gate stacks by an etching process, resulting a first gate trench and a second gate trench in the ILD layer;
depositing a first tantalum titanium nitride layer in the first and second gate trenches;
depositing a titanium aluminum nitride layer on the first tantalum titanium nitride layer to fill in the first and second gate trench;
forming a patterned mask to cover the second region and uncover the first region;
performing an etching process to the titanium aluminum nitride layer in the first gate trench such that the titanium aluminum nitride layer is recessed;
depositing a second tantalum titanium nitride layer on the recessed titanium aluminum nitride layer in the first gate trench; and
filling a low resistance metal in the first gate trench, thereby forming a first gate stack in the first gate trench and a second gate stack in the second gate trench, and wherein the first and second gate stacks are different in structure.

12. The method of claim 11, wherein the filling the low resistance metal layer in the first gate trench includes depositing one of tungsten, copper, aluminum, copper aluminum alloy and a combination thereof.

13. The method of claim 12, prior to the depositing of the first tantalum titanium nitride layer, further comprising depositing a high-k dielectric material layer in the first and second gate trenches.

14. The method of claim 13, wherein
the first gate stack includes a first segment on the first fin active region and a second segment being extended from the first fin active region onto a shallow trench isolation (STI) feature;
the second segment of the first gate stack includes the first and second tantalum titanium nitride layers with the titanium aluminum nitride layer interposed therebetween; and
the first segment of the first gate stack defines a first air gap surrounded by the second tantalum titanium nitride layer while the second segment is free of void.

15. The method of claim 14, wherein
the second gate stack includes a third segment on the second fin active region and a fourth segment being extended from the second fin active region onto the STI feature;
the fourth segment of the second gate stack defines a second air gap surrounded by the first tantalum titanium nitride layer; and
the third segment of the second gate stack defines a third air gap surrounded by the first tantalum titanium nitride layer.

16. The method of claim 15, wherein the third air gap in the third segment of the second gate stack has a volume being greater than a volume of the second air gap in the fourth segment of the second gate stack.

17. A method, comprising:
forming isolation features in a semiconductor substrate, defining first fins in a first region and second fins in a second region;
forming a first dummy gate stack on the first fins and a second dummy gate stack on the second fins;
depositing an inter-layer dielectric (ILD) layer on the substrate;
removing the first and second dummy gate stacks by an etching process, resulting a first gate trench and a second gate trench in the ILD layer;

depositing a first tantalum titanium nitride layer in the first and second gate trenches;

depositing a titanium aluminum nitride layer on the first tantalum titanium nitride layer to fill in the first and second gate trench;

forming a patterned mask to cover the second region and uncover the first region;

performing an etching process to the titanium aluminum nitride layer in the first gate trench such that the titanium aluminum nitride layer is recessed;

depositing a second tantalum titanium nitride layer on the recessed titanium aluminum nitride layer in the first gate trench; and filling a low resistance metal in the first gate trench, thereby forming a first gate stack is formed in the first gate trench and a second gate stack in the second gate trench, and wherein the first gate stack is free of the low resistance metal.

18. The method of claim 17, wherein the filling the low resistance metal layer in the first gate trench includes depositing one of tungsten, copper, aluminum, copper aluminum alloy and a combination thereof.

19. The method of claim 17, wherein the first gate stack includes a first segment on the first fin active region and a second segment being extended from the first fin active region onto a shallow trench isolation (STI) feature;

the second segment of the first gate stack includes the first and second tantalum titanium nitride layers with the titanium aluminum nitride layer interposed therebetween; and the first segment of the first gate stack defines a first air gap surrounded by the second tantalum titanium nitride layer while the second segment is free of void.

20. The method of claim 19, wherein the second gate stack includes a third segment on the second fin active region and a fourth segment being extended from the second fin active region onto the STI feature;

the fourth segment of the second gate stack defines a second air gap surrounded by the first tantalum titanium nitride layer;

the third segment of the second gate stack defines a third air gap surrounded by the first tantalum titanium nitride layer; and the third air gap in the third segment of the second gate stack has a volume being greater than a volume of the second air gap in the fourth segment of the second gate stack.

* * * * *